United States Patent
Mennenga et al.

(10) Patent No.: US 11,309,034 B2
(45) Date of Patent: Apr. 19, 2022

(54) MEMORY CELL ARRANGEMENT AND METHODS THEREOF

(71) Applicant: Ferroelectric Memory GmbH, Dresden (DE)

(72) Inventors: Menno Mennenga, Dresden (DE); Johannes Ocker, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 16/929,685

(22) Filed: Jul. 15, 2020

(65) Prior Publication Data

US 2021/0090662 A1   Mar. 25, 2021

(51) Int. Cl.
| | |
|---|---|
| *G11C 16/24* | (2006.01) |
| *G11C 16/30* | (2006.01) |
| *G11C 16/08* | (2006.01) |

(52) U.S. Cl.
CPC .............. *G11C 16/24* (2013.01); *G11C 16/08* (2013.01); *G11C 16/30* (2013.01)

(58) Field of Classification Search
CPC .......... G11C 16/24; G11C 16/08; G11C 16/30
See application file for complete search history.

(56) References Cited

U.S. PATENT DOCUMENTS

| | | | |
|---|---|---|---|
| 6,982,453 | B2 | 1/2006 | Kanaya |
| 8,829,646 | B2 | 9/2014 | Lung |
| 10,262,730 | B1 | 4/2019 | Nardi et al. |
| 2002/0089871 | A1* | 7/2002 | Jeon ........................ G11C 11/22 365/145 |
| 2009/0034162 | A1 | 2/2009 | Yawata |
| 2011/0278527 | A1 | 11/2011 | Ishibashi |
| 2012/0032249 | A1 | 2/2012 | Matsuda |
| 2013/0032874 | A1 | 2/2013 | Ko |
| 2014/0198553 | A1 | 7/2014 | Lung |
| 2015/0261437 | A1 | 9/2015 | Lee et al. |
| 2017/0352671 | A1 | 12/2017 | Kato |
| 2019/0088871 | A1 | 3/2019 | Kim et al. |

(Continued)

OTHER PUBLICATIONS

Li et al., "Selector-free Hafnium-Zirconium Oxide Ferroelectric Memory and Application in NVSRAM", 2018 IEEE International Electron Devices Meeting (IEDM). Dated Aug. 3, 2018, 4 pages.

(Continued)

*Primary Examiner* — Tuan T Nguyen
(74) *Attorney, Agent, or Firm* — Hickman Becker Bingham Ledesma LLP; Malgorzata A. Kulczycka

(57) ABSTRACT

A memory cell arrangement is provided that may include: a plurality of first control lines; a plurality of second control lines; a plurality of third control lines; each of a plurality of memory cell sets includes memory cells and is assigned to a corresponding one of the plurality of first control lines and includes at least a first memory cell subset addressable via the corresponding first control line, a corresponding one of the plurality of second control lines, and the plurality of third control lines, and at least a second memory cell subset addressable via the corresponding first control line, the plurality of second control lines, and a corresponding one of the plurality of third control lines. The corresponding one of the plurality of third control lines addresses the second memory cell subset of each memory cell set of the plurality of memory cell sets.

17 Claims, 9 Drawing Sheets

(56) References Cited

U.S. PATENT DOCUMENTS

| | | |
|---|---|---|
| 2019/0221612 A1 | 7/2019 | Kim et al. |
| 2019/0393167 A1* | 12/2019 | Bedeschi ............ G11C 11/1653 |
| 2020/0194431 A1 | 6/2020 | Castro et al. |
| 2020/0235050 A1 | 7/2020 | Lee |
| 2021/0082958 A1 | 3/2021 | Mennenga |
| 2021/0091097 A1 | 3/2021 | Mennenga |

OTHER PUBLICATIONS

Hou et all, "Investigation for the Feasibility of High-Mobility Channel in 3D NAND Memory", ECS Journal of Solid State Science and Technology, dated 2018, 6 pages.

Buck, Dudley, "Ferroelectrics for Digital Information Storage and Switching", Digital Computer Laboratory Massachusetts Institute of Technology, dated Jun. 5, 1952, 72 pages.

* cited by examiner

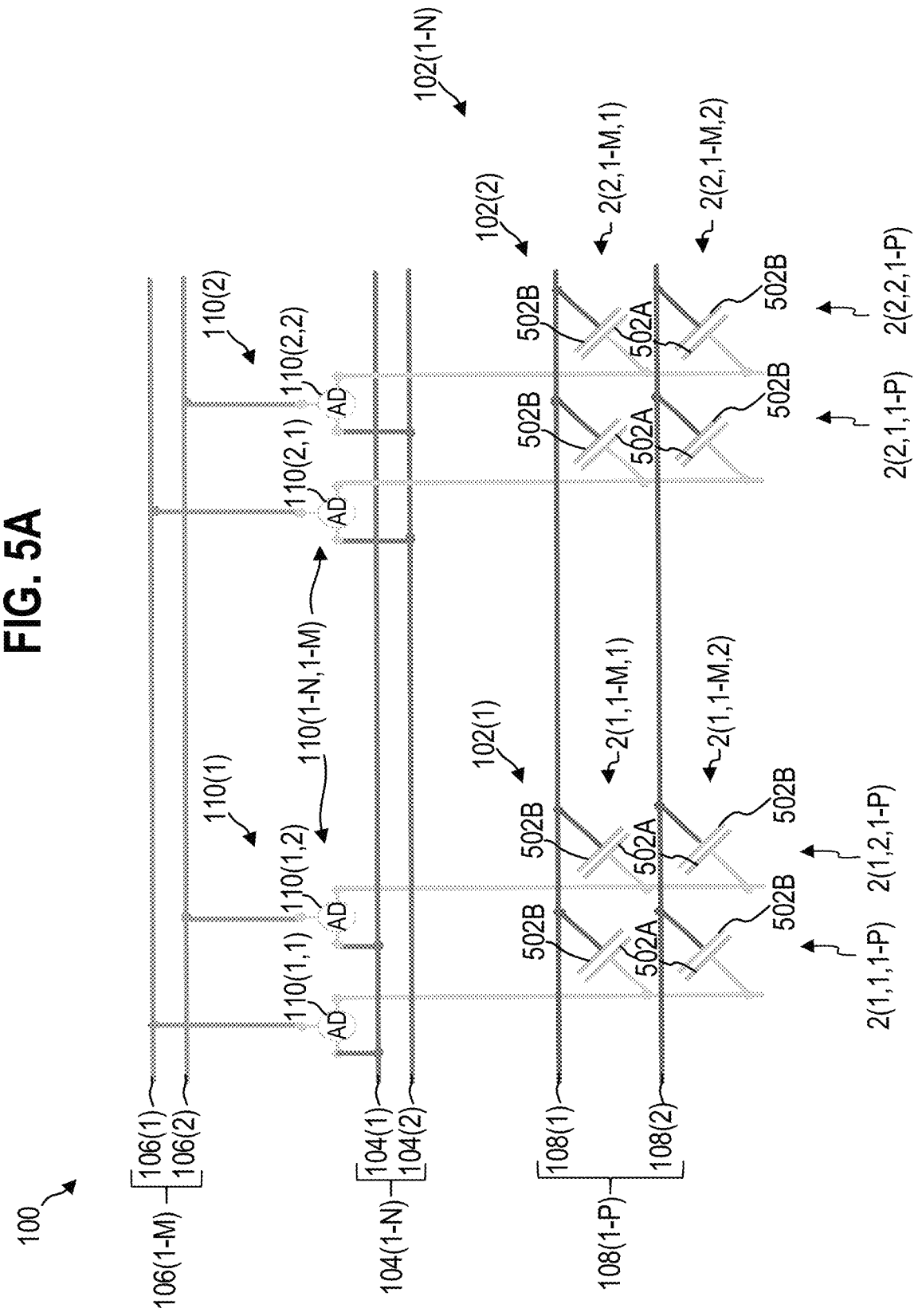

MEMORY CELL ARRANGEMENT AND METHODS THEREOF

TECHNICAL FIELD

Various aspects relate to a memory cell arrangement, and methods thereof, e.g., a method for operating a memory cell arrangement.

BACKGROUND

In general, various computer memory technologies have been developed in the semiconductor industry. A fundamental building block of a computer memory may be referred to as memory cell. The memory cell may be an electronic circuit that is configured to store at least one information (e.g., bitwise). As an example, the memory cell may have at least two memory states representing, for example, a logic "1" and a logic "0". In general, the information may be maintained (stored) in a memory cell until the memory state of the memory cell is modified, e.g., in a controlled manner. The information stored in the memory cell may be obtained by determining in which of the memory states the memory cell is residing in. At present, various types of memory cells may be used to store data. Typically, a large number of memory cells may be implemented in a memory cell array, wherein each of the memory cells or predefined groups of memory cells may be individually addressable. In this case, the information may be read out by addressing the memory cells accordingly. Furthermore, various driver circuits have been developed in semiconductor industry to control an operation of one or more memory cells of a memory device. The memory cells may be implemented in such a way that each single memory cell or at least various groups of memory cells is unambiguously addressable, e.g., for writing (e.g., programming and/or erasing) and/or reading the respective memory cell or groups of memory cells.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 5A schematically shows a capacitor-based memory cell arrangement, according to various aspects;

DESCRIPTION

Figure 1:
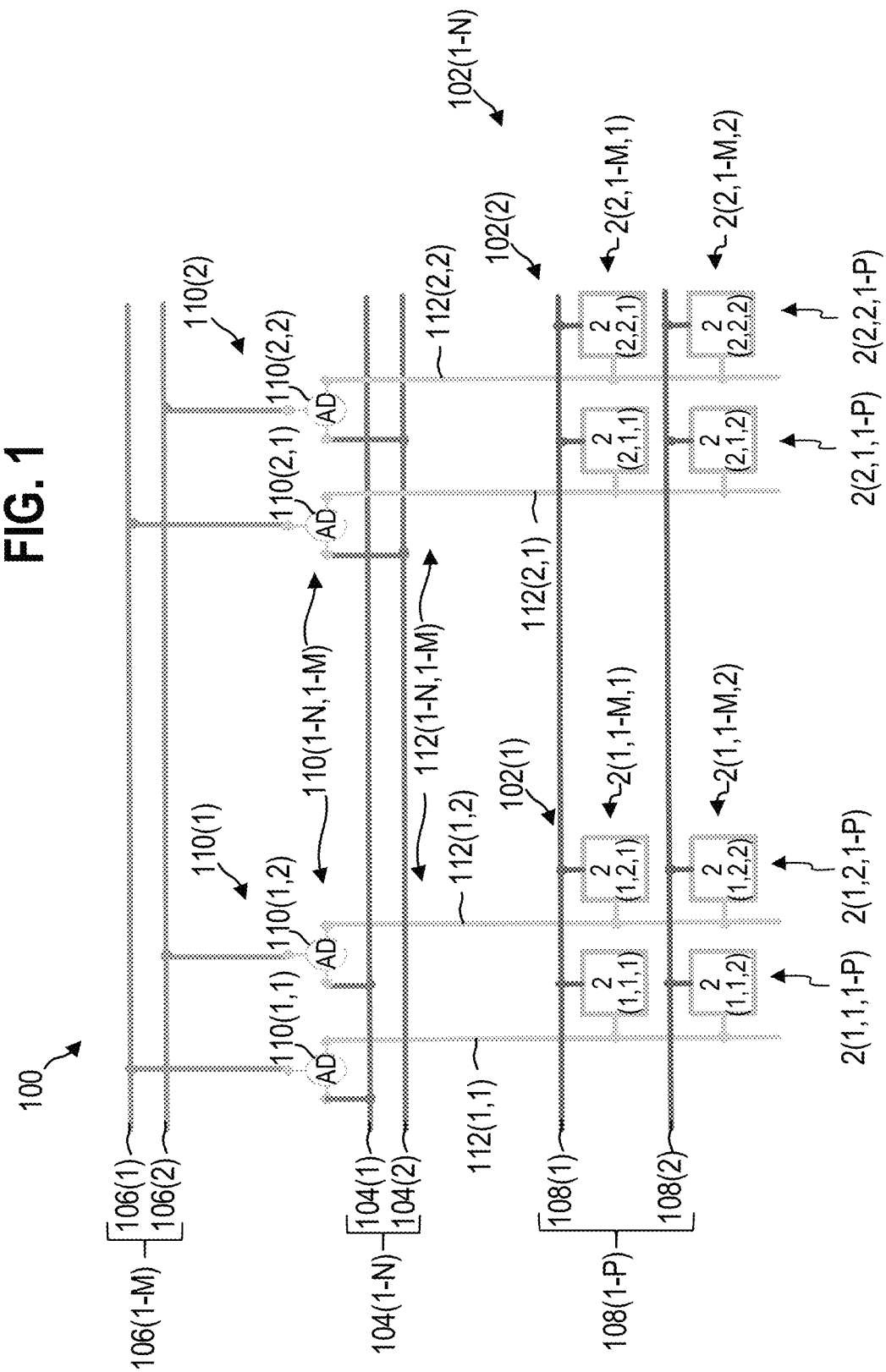
FIG. 1 schematically shows a memory cell arrangement, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices (e.g., arrangements). However, it may be understood that aspects described in connection with methods may similarly apply to the devices, and vice versa.

The terms "at least one" and "one or more" may be understood to include any integer number greater than or equal to one, i.e., one, two, three, four, [ . . . ], etc. The term "a plurality" may be understood to include any integer number greater than or equal to two, i.e., two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The phrase that an element or a group of elements "includes" another element or another group of elements may be used herein to mean that the other element or other group of elements may be part of the element or the group of elements or that the element or the group of elements may be configured or formed as the other element or the other group of elements (e.g., the element may be the other element).

The phrase "unambiguously assigned" may be used herein to mean a one-to-one-assignment (e.g., allocation, e.g., correspondence) or a bijective assignment. As an example, a first element being unambiguously assigned to a second element may include that the second element is unambiguously assigned to the first element. As another example, a first group of elements being unambiguously assigned to a second group of element may include that each element of the first group of elements is unambiguously assigned to a corresponding element of the second group of elements and that that corresponding element of the second group of elements is unambiguously assigned to the element of the first group of elements.

The term "connected" may be used herein with respect to nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

The term "voltage" may be used herein with respect to "one or more bitline voltages", "one or more wordline voltages", "one or more plateline voltages", "one or more sourceline voltages", "one or more control line voltages", "one or more base voltages" and the like. As an example, the term "base voltage" may be used herein to denote a reference voltage and/or a reference potential for the circuit. With respect to an electrical circuit, the base voltage may be also referred to as ground voltage, ground potential, virtual ground voltage, or zero volts (0 V). The base voltage of an electrical circuit may be defined by the power supply used to operate the electronic circuit. As another example, the term "control line voltage" may be used herein to denote a voltage that is provided to a control line, e.g., of a memory cell arrangement (for example a "wordline voltage" may be provided to a "wordline", a "bitline voltage" may be provided to a bitline, and a "sourceline voltage" may be provided to a sourceline). The sign of a voltage difference (e.g., a voltage drop) may be defined as a potential inside a memory cell (e.g., at a first electrode portion) minus a potential at a second electrode portion of the memory cell.

Illustratively, a voltage provided to a node or a terminal may assume any suitable value depending on the intended operation of the circuit including the node or terminal. For example, a bitline voltage (referred to as $V_{BL}$ or VBL) may be varied depending on the intended operation of the memory cell arrangement. Analogously, a wordline voltage (referred to as $V_{WL}$ or VWL), a plateline voltage (referred to as $V_{PL}$ or VPL), and/or sourceline voltage (referred to as $V_{SL}$ or VSL) may be varied depending on the intended operation of a memory cell arrangement. A voltage provided to a node or terminal may be defined by the respective potential applied to that node or terminal relative to the base voltage (referred to as Vs) of the circuit. Further, a voltage drop associated with two distinct nodes or terminals of a circuit may be defined by the respective voltages/potentials applied at the two nodes or terminals. As an example, a bitline voltage drop associated with a memory cell of a memory cell arrangement (e.g., an electrode of the memory cell) may be defined by the respective voltages/potentials applied at the corresponding memory cell (e.g., the electrode of the memory cell).

In some aspects, two voltages may be compared with one another by relative terms such as "greater", "higher", "lower", "less", or "equal", for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

According to various aspects, a memory cell may be addressed via a corresponding access device. An access device may include or may be, for example, a field effect transistor (FET), such as an n-type or p-type field-effect transistor, a transmission gate, such as an n-type-based or p-type-based transmission gate, or the like. An access device may have a threshold voltage associated therewith. A threshold voltage of an access device (e.g., a field-effect transistor) may be defined by the properties of the access device (e.g., the field-effect transistor), such as the material(s), the doping (s), etc., and it may thus be a (e.g., intrinsic) property of the access device.

According to various aspects, a memory cell may have at least two distinct states associated therewith, for example with two distinct electrical conductivities that can be determined to evaluate in which of the at least two distinct states the memory cell is residing in. A memory cell in general may include a phase-change or phase-change-based memory cell, a ferroelectric or ferroelectric-based memory cell, a remanent-polarizable memory cell, a capacitor or capacitor-based memory cell, and/or a ferroelectric-capacitor or ferroelectric-capacitor-based memory cell ("FeCAP"). A memory cell may include at least a first memory state and a second memory state. In some aspects, the memory state in which a memory cell is residing in may influence a current characteristic and/or voltage characteristic during readout of the memory cell. The first memory state may be, for example, associated with a logic "1" and the second memory state may be, for example, associated with a logic "0". However, the definition of the memory states and/or the definition of a logic "0" and a logic "1" may be selected arbitrarily.

For example, a phase-change memory cell may include a phase change portion. The phase-change portion may be used to implement memory functions, e.g., in a memory cell. The phase-change portion may include a first phase state and a second phase state. For example, a phase-change memory cell may change from a first phase state to a second phase state or vice versa upon applying an electrical signal and may remain in the respective phase state for at least some time (referred to as retention time).

According to various aspects, a remanent-polarizable memory cell may include a remanently-polarizable portion (also referred to as remanent-polarizable portion). The remanent-polarizable portion may be used to implement memory functions, e.g., in a memory cell. Therefore, according to various aspects, a memory cell may be implemented as a capacitor structure, e.g., as a remanent-polarizable capacitor (also referred to as ferroelectric capacitor—"FeCAP"). In general, a remanent polarization (also referred to as retentivity or remanence) may be present in a material portion (e.g., a material layer) in the case that the material may remain polarized upon reduction of an applied electric field, E, to zero; therefore, a certain value for the electrical polarization, P, of the material portion may be detected. Illustratively, a polarization remaining in a material when the electric field is reduced to zero may be referred to as remanent polarization or residual polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to describe remanent magnetization in magnetic materials.

Further, a remanent-polarizable material may include a spontaneously polarization, for example, with reference to the polarization capability of a material beyond dielectric polarization. The coercivity of a material may be a measure of the strength of the reverse polarizing electric field that may be required to remove a remanent polarization. According to various aspects, an electric coercive field (also referred to as coercive field) may be or represent the electric field required to depolarize a remanent-polarizable layer. A remanent polarization may be evaluated via analyzing one or more hysteresis measurements (e.g., hysteresis curves), e.g., in a plot of polarization, P, versus electric field, E, in which the material is polarized into opposite directions. The polarization capability of a material (dielectric, spontaneous and remanent polarization) may be analyzed using capacity spectroscopy, e.g., via a static (C-V) and/or time-resolved measurement or by polarization-voltage (P-V) or positive-up-negative-down (PUND) measurements.

The polarization state of the remanent-polarizable portion may be switched by means of a capacitor structure. The polarization state of the remanent-polarizable portion may be read out by means of the capacitor structure. The polarization state of the remanent-polarizable portion may define a memory state, e.g., of a memory cell. As an example, the polarization state of the remanent-polarizable portion may influence one or more electrical characteristics of the capacitor structure, e.g., a charging current during charging the capacitor structure.

In a usual capacitor structure, the amount of charge stored therein may be used to define a memory state (e.g., first amount of charge stored in the capacitor structure may define a first memory state and a second amount of charge stored in the capacitor structure may define a second memory state.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming a remanent-polarizable memory cell may modify the polarization state of the remanent-polarizable memory cell from the first polarization state to the second polarization state (e.g., opposite to the first polarization state). According to various aspects, writing a memory cell may include erasing a memory cell (e.g., performing an erasing operation of a memory cell), wherein the memory state the memory cell is residing in after the erasing may be called "erased state". For example, erasing a remanent-polarizable memory cell may modify the polarization state of the remanent-polarizable memory cell from the second polarization state to the first polarization state. As an example, the programmed state may be associated with a logic "1" and the erased state may be associated with a logic "0". However, the definition of programmed state and erased state may be selected arbitrarily.

The term "switch" may be used herein to describe a modification of the memory state a memory cell is residing in. For example, in the case that a memory cell is residing in a first memory state, the memory state the memory cell is residing in may be switched such that, after the switch, the memory cell may reside in a second memory state, different from the first memory state. The term "switch" may thus be used herein to describe a modification of the memory state a memory cell is residing in, from a first memory state to a second memory state. The term "switch" may also be used herein to describe a modification of a polarization, for example of a remanent-polarizable portion. For example, a polarization of a remanent-polarizable portion may be switched, such that the sign of the polarization varies from positive to negative or from negative to positive, while the absolute value of the polarization may remain in some aspects substantially unaltered.

According to various aspects, a ferroelectric-capacitor-based memory cell ("FeCAP") may include a capacitor structure including a ferroelectric material as a remanent-polarizable portion (e.g., a ferroelectric capacitor). The term "ferroelectric" may be used herein, for example, to describe a material that shows a hysteretic charge voltage relationship (Q-V). The ferroelectric material may be or may include ferroelectric $HfO_2$. Ferroelectric $HfO_2$ may include any form of hafnium oxide that may exhibit ferroelectric properties. This may include, for example, $HfO_2$, $ZrO_2$, a solid solution of $HfO_2$ and $ZrO_2$ (e.g., but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide. According to various aspects, a ferroelectric material may be an example of a material used in a remanent-polarizable portion. According to various aspects, a ferroelectric portion may be an example of a remanent-polarizable portion.

In the semiconductor industry, the integration of non-volatile memory technologies may be useful for System-on-Chip (SoC) products like microcontrollers (MCU), etc. According to various aspects, a non-volatile memory may be integrated next to a processor core of a processor. As another example, one or more non-volatile memories may be used as part of a mass storage device. In some aspects, a non-volatile memory technology may be based on a memory cell arrangement as described below. The memory cell arrangement may include FeCAP memory cells. Since a ferroelectric material included in a FeCAP memory cell may have at least two stable polarization states, the ferroelectric capacitor may be used as a non-volatile memory cell. Thus, a FeCAP memory cell stores data by means of a ferroelectric material between at least a first electrode and a second electrode of a capacitor structure. According to various aspects, a non-volatile field-effect transistor based memory structure or memory cell may store data for a period of time from hours (e.g., more than 5 hours) to several tens of years (e.g., 10 years, 20 years, etc.), whereas a volatile memory cell may store data for a period of time from nanoseconds to hours (e.g., less than 5 hours).

In comparison to other emerging memory technologies, a remanent-polarizable memory cell, such as a FeCAP based memory cell, may be integrated in the Front-End-of-Line (FEoL) and/or in the Back-End-of-Line (BEoL) process flow, since it may be implemented as a capacitor-type of memory. Accordingly, the integration of the FeCAP based memory cell may comply with a standard FEoL and/or BEoL complementary metal-oxide-semiconductor (CMOS) process flow. Consequently, various integration schemes may be used to integrate a FeCAP based memory cell in different process technologies.

In some aspects, a memory cell arrangement (e.g., an array including a plurality of memory cells) may be operated based on one or more write operations (e.g., program and/or erase operations) and/or one or more readout operations. During a write operation, as example, predefined voltages may be provided to electrical lines (also referred to as control lines or driver-lines), wherein the electrical lines may be connected to the respective nodes (e.g., respective electrodes) of the memory cells to allow for the desired operation. The electrical lines may be referred to, for example, as bitlines, wordlines, platelines, and/or source-lines. All memory cells that are not intended to be written may see a voltage that is at least less than the programming voltage. The programming voltage may be defined by the type and/or design of memory cell. In some aspects, the programming voltage may be in the range from about 1 V to about 10 V. The programming voltage may be determined via one or more electrical measurements. Various timings may be used to provide the respective voltages, e.g., to provide the desired write voltages and/or the desired readout voltages.

In general, a memory cell arrangement may include a plurality of (e.g., volatile or non-volatile) memory cells, which may be accessed individually or on groups via a corresponding addressing scheme. The matrix architecture may be, for example, referred to as "NOR" or "NAND" architecture, depending on the way neighboring memory cells are connected to each other, i.e., depending on the way the terminals of neighboring memory cells are shared, but are not limited to these two types (another type is for example an "AND" architecture). For example, in a NAND architecture the memory cells may be organized in sectors (also referred to as blocks) of memory cells, wherein the memory cells are serially connected in a string (e.g., source and drain regions are shared by neighboring transistors), and the string is connected to a first control line and a second control line. For example, groups of memory cells in a NAND architecture may be connected in series with one another. In a NOR architecture the memory cells may be connected in parallel with one another. A NAND architecture may thus be more suited for serial access to data stored in the memory cells, whereas a NOR architecture may be more suited for random access to data stored in the memory cells.

Various aspects are related to a memory cell arrangement including one or more memory cells. The one or more memory cells may be, for example, one or more FeCAP memory cells. In some aspects, a control circuit may be configured to carry out and/or instruct one or more write operations associated with a writing of one or more memory cells of the memory cell arrangement. In some aspects, a control circuit may be used to control a writing of a single memory cell of the memory cell arrangement (illustratively, a memory cell that is intended to be written). According to various aspects, writing a memory cell may include bringing the memory cell from one of at least two memory states into another one of the at least two memory states of the memory cell.

According to various aspects, a memory cell arrangement may include a plurality of memory cell sets. Each memory cell set of the plurality of memory cell sets may include a plurality of memory cells. The memory cell arrangement may further include a plurality of first control lines, a plurality of second control lines, and a plurality of third control lines. Each memory cell set of the plurality of memory cell sets may be assigned to a corresponding first control line of the plurality of first control lines. Each memory cell set of the plurality of memory cell sets may include at least a first memory cell subset addressable via the corresponding first control line, a corresponding second control line of the plurality of second control lines, and the plurality of third control lines. Each memory cell set of the plurality of memory cell sets may include at least a second memory cell subset addressable via the corresponding first control line, the plurality of second control lines, and a corresponding third control line of the plurality of third control lines. The corresponding third control line of the plurality of third control lines may address the second memory cell subset of each memory cell set of the plurality of memory cell sets.

According to various aspects, a memory cell arrangement may include a plurality of memory cell sets. Each memory cell set of the plurality of memory cell sets may include a plurality of memory cells. Each memory cell of the plurality of memory cells of the respective memory cell set may be unambiguously assigned to one of a plurality of first memory cell subsets and one of a plurality of second memory cell subsets. The memory cell arrangement may include a plurality of access device sets. Each access device set may include one or more (e.g., two or more) access devices. Each of the plurality of access device sets may be unambiguously assigned to a corresponding memory cell set of the plurality of memory cell sets. For, each access device set of the plurality of access device sets, each access device of the one or more (e.g., two or more) access devices may be unambiguously assigned to one of the plurality of first subsets of the corresponding memory cell sets. The memory cell arrangement may include a plurality of first control lines. Each of the plurality of first control lines may be unambiguously assigned to one access device set of the plurality of access device sets. The memory cell arrangement may include a plurality of second control lines. Each of the plurality of second control lines may be assigned to a corresponding access device of each of the plurality of access device sets. The memory cell arrangement may include a plurality of third control lines. Each of the plurality of third control lines may be assigned to a corresponding second memory cell subset of the plurality of second memory cell subsets of each of the plurality of memory cell sets.

According to various aspects, a memory cell arrangement may include a first memory cell set including a first memory cell, a second memory cell, a third memory cell, and a fourth memory cell, and a second memory cell set including a first memory cell, a second memory cell, a third memory cell, and a fourth memory cell. The memory cell arrangement may include a first control line set including a first control line assigned to each memory cell of the first memory cell set and a second control line assigned to each memory cell of the second memory cell set. The memory cell arrangement may include a second control line set including a first control line and a second control line, the first control line of the second control line set being assigned to the first memory cell and the second memory cell of the first memory cell set and to the first memory cell and the second memory cell of the second memory cell set, and the second control line of the second control line set being assigned to the third memory cell and the fourth memory cell of the first memory cell set and the third memory cell and the fourth memory cell of the second memory cell set. The memory cell arrangement may include a third control line set including a first control line and a second control line, the first control line of the third control line set being assigned to the first memory cell and the third memory cell of the first memory cell set and to the first memory cell and the third memory cell of the second memory cell set, and the second control line of the third control line set being assigned to the second memory cell and the fourth memory cell of the first memory cell set and the second memory cell and the fourth memory cell of the second memory cell set.

According to various aspects, a memory cell arrangement may include a first memory cell set including a first memory cell, a second memory cell, a third memory cell, and a fourth memory cell, and a second memory cell set including a first memory cell, a second memory cell, a third memory cell, and a fourth memory cell. The memory cell arrangement may include a first bitline assigned to each memory cell of the first memory cell set and a second bitline assigned to each memory cell of the second memory cell set. The memory cell arrangement may include a first wordline assigned to the first memory cell and the second memory cell of the first memory cell set and to the first memory cell and the second memory cell of the second memory cell set, and a second wordline assigned to the third memory cell and the fourth memory cell of the first memory cell set and the third memory cell and the fourth memory cell of the second memory cell set. The memory cell arrangement may include a first plateline assigned to the first memory cell and the third memory cell of the first memory cell set and to the first memory cell and the third memory cell of the second memory cell set, and a second plateline assigned to the second memory cell and the fourth memory cell of the first memory cell set and the second memory cell and the fourth memory cell of the second memory cell set.

According to various aspects, a memory cell arrangement may include a first memory cell, a second memory cell, a third memory cell, and a fourth memory cell, a fifth memory cell, a sixth memory cell, a seventh memory cell, and an eighth memory cell. The memory cell arrangement may include a first bitline assigned to the first memory cell, the second memory cell, the third memory cell, and the fourth memory cell. The memory cell arrangement may include a second bitline assigned to the fifth memory cell, the sixth memory cell, the seventh memory cell, and the eighth memory cell. The memory cell arrangement may include a first wordline assigned to the first memory cell, the second memory cell, the fifth memory cell, and the sixth memory cell, and a second wordline assigned to the third memory cell, the fourth memory cell, the seventh memory cell, and the eighth memory cell. The memory cell arrangement may include a first plateline assigned to the first memory cell, the third memory cell, the fifth memory cell, and the seventh memory cell. The memory cell arrangement may include a second plateline assigned to the second memory cell, the fourth memory cell, the sixth memory cell, and the eighth memory cell.

According to various aspects, a method, e.g., a method of operating a memory cell arrangement, may include applying a first voltage of a first control line of a plurality of first control lines corresponding to a memory cell to be addressed (e.g., to be programmed, erased, or read out) of a plurality of memory cells. The method may further include applying a second voltage to a second control line of a plurality of second control lines corresponding to the memory cell to be addressed. The method may include applying a third voltage to a third control line of a plurality of third control lines corresponding to the memory cell to be addressed.

FIG. 1 illustrates schematically an exemplary configuration of a memory cell arrangement 100, according to various aspects. The memory cell arrangement 100 may include a plurality of first control lines 104(1-N). In the following, the plurality of first control lines 104(1-N) may also be referred to as first control line set 104(1-N), bitlines 104(1-N) or plurality of bitlines 104(1-N). However, the term "bitline" used with respect to the first control lines 104(1-N) may be chosen differently. The plurality of first control lines 104(1-N) may include a first number, N, of first control lines 104($n$). Hence, the plurality of first control lines 104(1-N) may include first control lines 104($n$) from n=1 to n=$n_{max}$, wherein the first number, N, may correspond to $n_{max}$. The first number, N, may be an integer number greater than one (e.g., two or more than two, e.g., greater than one-hundred, e.g., greater than one-thousand, e.g., greater than ten-thousand). The memory cell arrangement 100 may include a plurality of memory cell sets 102(1-N). The plurality of memory cell sets 102(1-N) may include a number of memory cell sets 102($n$) equal to the first number, N. Each memory cell set 102($n$) of the plurality of memory cell sets 102(1-N) may be assigned to a corresponding first control line 104($n$) of the plurality of the plurality of first control lines 104(1-N). For example, each memory cell set 102($n$) of the plurality of memory cell sets 102(1-N) may be unambiguously (e.g., bijectively) assigned to a corresponding first control line 104($n$) of the plurality of the plurality of first control lines 104(1-N). For example, a memory cell set 102($n^*$) may be unambiguously assigned to a corresponding first control line 104($n^*$) and the first control line 104($n^*$) may be unambiguously assigned to the memory cell set 102($n^*$). In the following, the *-notation may define one specific integer for the corresponding variable, such as a specific n* for the variable n, a specific m* for the variable m, and/or a specific p* for the variable p.

The memory cell arrangement 100 may include a plurality of second control lines 106(1-M). In the following, the plurality of second control lines 106(1-M) may also be referred to as second control line set 106(1-M), wordlines 106(1-M) or plurality of wordlines 106(1-M). However, the term "wordline" used with respect to the second control lines 106(1-M) may be chosen differently. The plurality of second control lines 106(1-M) may include a second number, M, of second control lines 106($m$). Hence, the plurality of second control lines 106(1-M) may include second control lines 106($m$) from m=1 to m=$m_{max}$, wherein the second number, M, may correspond to $m_{max}$. The second number, M, may be an integer number greater than one (e.g., two or more than two, e.g., greater than one-hundred, e.g., greater than one-thousand, e.g., greater than ten-thousand).

The memory cell arrangement 100 may include a plurality of third control lines 108(1-P). In the following, the plurality of third control lines 108(1-P) may also be referred to as third control line set 108(1-P), platelines 108(1-P) or plurality of platelines 108(1-P). However, the term "plateline" used with respect to the third control lines 108(1-P) may be chosen differently. The plurality of third control lines 108(1-P) may include a third number, P, of third control lines 108($p$). Hence, the plurality of third control lines 108(1-P) may include third control lines 108($p$) from p=1 to p=$p_{max}$, wherein the third number, P, may correspond to $p_{max}$. The third number, P, may be an integer number greater than one (e.g., two or more, e.g., greater than one-hundred, e.g., greater than one-thousand, e.g., greater than ten-thousand).

The memory cell arrangement 100 may include a plurality of memory cells 2(1-N,1-M,1-P), wherein the notation (1-N, 1-M,1-P) may be also described by the notation (n, m, p) with n=1–N, m=1–M, and p=1–P, thus, n being any integer value in the range from 1 to N, m being any integer value in the range from 1 to M, and p being any integer value in the range from 1 to P. Even though FIG. 1 shows eight memory cells being an example with N=2, M=2, and P=2, it should be noted that the memory cell arrangement 100 may include any number of memory cells described by any first number N, any second number M, and any third number P.

Each memory cell 2(n,m,p) of the plurality of memory cells 2(1-N,1-M,1-P) of the memory cell arrangement 100 may correspond to a first control line 104($n$), a second control line 106($m$), and a third control line 108($p$). The plurality of memory cells 2(1-N,1-M,1-P) may include a number of memory cells 2(n,m,p) equal to the product (multiplication product) of the first number N, the second number M, and the third number P, i.e., the number of memory cells 2($n,m,p$) may be equal to N*M*P. Each memory cell 2(n,m,p) of the plurality of memory cells 2(1-N,1-M,1-P) may be a volatile or a non-volatile memory cell.

Each memory cell set 102(n) of the plurality of memory cell sets 102(1-N) may include a plurality of memory cells 2(n,1-M,1-P). Each memory cell set 102(n) of the plurality of memory cell sets 102(1-N) may include at least a first memory cell subset addressable via the corresponding first control line 104(n), a corresponding second control line 106(m) of the plurality of second control lines 106(1-M), and the plurality of third control lines 108(1-P). Each memory cell set 102(n) of the plurality of memory cell sets 102(1-N) may include at least a second memory cell subset addressable via the corresponding first control line 104(n), the plurality of second control lines 106(1-M), and a corresponding third control line 108(p) of the plurality of third control lines 108(1-P). The corresponding third control line 108(p) may address the second memory cell subset of each memory cell set 102(n) of the plurality of memory cell sets 102(1-N).

For example, a memory cell set 102(n*) may include at least a first memory cell subset addressable via the corresponding first control line 104(n*), a corresponding second control line 106(m*), and the plurality of third control lines 108(1-P). Further, the memory cell set 102(n*) may include at least a second memory cell subset addressable via the corresponding first control line 104(n*), the plurality of second control lines 106(1-M), and a corresponding third control line 108(p*).

According to various aspects, each memory cell set 102 (n) of the plurality of memory cell sets 102(1-N) may include a plurality of first memory cell subsets including the first memory cell subset and one or more additional first memory cell subsets. The one or more additional first memory cell subsets may be addressable via the corresponding first control line 104(n*), one or more other corresponding second control line 106(m\m*) of the plurality of second control lines 106(1-M) (i.e., one or more corresponding second control lines 106(n) except for the second control line 106(m*)), and the plurality of third control lines 108 (1-P). For example, for a first memory cell set 102(1), the plurality of first memory cell subsets may include the first memory cell subset including the memory cells 2(1,1,1-P) and the additional first memory cell subset including the memory cells 2(1,2,1-P).

For each memory cell set 102(n) of the plurality of memory cell sets 102(1-N), the plurality of first memory cell subsets may include a number of first memory cell subsets equal to the second number, M. For each memory cell set 102(n) of the plurality of memory cell sets 102(1-N), each first memory cell subset of the plurality of first memory cell subsets may include a number of memory cells equal to the third number, P.

According to various aspects, each memory cell set 102 (n) of the plurality of memory cell sets 102(1-N) may include a plurality of second memory cell subsets including the second memory cell subset and one or more additional second memory cell subsets. The one or more additional second memory cell subsets may be addressable via the corresponding first control line 104(n*), the plurality of second control lines 106(1-M), and one or more other corresponding third control line 108(p\p*) of the plurality of third control lines 108(1-P) (i.e., one or more corresponding third control lines 108(p) except for the third control line 108(p*)). For example, for the first memory cell set 102(1), the plurality of second memory cell subsets may include the second memory cell subset including the memory cells 2(1,1-M,1) and the additional second memory cell subset including the memory cells 2(1,1-M,2).

For each memory cell set 102(n) of the plurality of memory cell sets 102(1-N), each second memory cell subset of the plurality of second memory cell subsets may include a number of memory cells equal to the second number, M.

According to various aspects, for each first memory cell subset of the plurality of first memory cell subsets, all memory cells of a respective first memory cell subset may be arranged in a corresponding space region (e.g., a region in a three-dimensional space). The space regions of all of the plurality of first memory cell subsets (the space regions of all first memory cell subsets of all memory cell sets 102(n)) may be arranged in an array configuration, e.g., a matrix architecture. The (two-dimensional) array A(n=1-N,m=1-M) may include N times M space regions. For example, the array (or matrix) A(n=1-N,m=1-M) may include N matrix columns and M matrix rows. According to various aspects, all memory cells 2(n,m,p) of the memory cell arrangement 100 may be arranged in a three-dimension (e.g., a regular three-dimensional) array configuration. The array A(n=1-N,m=1-M, p=1-P) may include N times M times P memory cells. For example, the three-dimensional array A(n=1-N, m=1-M, p=1-P) may include P times two-dimensional array A(n=1-N,m=1-M). For example, a layer may include a two-dimensional array A(n=1-N,m=1-M) (e.g., for p=1), and another layer (e.g., positioned above or below, such as directly above or directly below) may include another two-dimensional array A(n=1-N,m=1-M) (e.g., for p=2). See, only as an example, FIG. 5B that shows an array A(n=1-2, m=1-2, p=1-2) of 2×2×2 memory cells. As described above, each of the first number N, the second number M, and/or the third number P may be an integer number greater than one (e.g., two or more than two, e.g., greater than one-hundred, e.g., greater than one-thousand, e.g., greater than ten-thousand). Thus, the array A(n=1-N,m=1-M) and/or the array A(n=1-N,m=1-M, p=1-P) may include any arbitrary number of memory cells 2(n,m,p).

According to various aspects, the memory cell arrangement 100 may include a plurality of access devices 100(1-N,1-M). For each memory cell set 102(n) of the plurality of memory cell sets 102(1-N), each first memory cell subset (e.g., the first memory cell subset or the plurality of first memory cell subset) may be assigned to a corresponding access device 110(n,m) of the plurality of access devices 110(1-N,1-M). Each of the first memory cell subsets may be addressable via the corresponding access device 110(n,m). The respective corresponding access device 110(n,m) may connect the respective first memory cell subset to the corresponding first control line 104(n) controlled by the corresponding second control line 106(m). For example, a first memory cell subset may be unambiguously assigned to a corresponding first control line 104(n*) and a corresponding second control line 106(m*), and the corresponding access device 110(n*,m*) may connect the first memory cell subset to the corresponding first control line 104(n*) controlled by the corresponding second control line 106(m*).

The plurality of access devices 110(1-N,1-M) may include a fourth number, N×M, of access devices 110(n,m). The fourth number, N×M, may be equal to the (multiplication) product of the first number, N, and the second number, M.

For example, each access device 110(n,m) may be unambiguously assigned to an access device set 110(n) of a plurality of access device sets 110(1-N). Each access device set 110(n) of the plurality of access device sets 110(1-N) may be unambiguously assigned to a correspond memory cell set 102(n) of the plurality of memory cell sets 102(1-N). Each access device set 110(n) of the plurality of access device sets 110(1-N) may include one or more (e.g., two or more) access devices 110(n,1-M). For each memory cell set 102(n) of the plurality of memory cell sets 102(1-N), each access device 110(n,1-M) may be unambiguously assigned a first memory cell subset of the plurality of memory cell subsets. Each first control line 104(n) of the plurality of first control lines 104(1-N) may be unambiguously assigned to an access device set 110(n) of the plurality of access device sets 110(1-N). Each second control line 106(m) of the plurality of second control lines 106(1-M) may be assigned to a corresponding access device 110(n,m) of each access device set 110(n) the plurality of access device sets 110(1-N). For example, a second control line 106(m*) of the plurality of second control lines 106(1-M) may be assigned to a corresponding access device 110(1-N,m*) of each of the plurality of access device sets 110(1-N).

According to various aspects, one or more of the access devices 110(n,m) (of the plurality of access device 110(n,m)) may include a respective transmission gate or a respective transistor, such as a field-effect transistor. Each access device 110(n,m) may include a first control node (e.g., a source node), a second control node (e.g., a gate node), and a third node (e.g., a drain node). The first control node of each access device 110(n,m) may be connected to the corresponding first control line 104(n) of the plurality of first control lines 104(1-N). The second control node of each access device 110(n,m) may be connected to the corresponding second control line 106(m) of the plurality of second control lines 106(1-M). The third control node of each access device 110(n,m) may be connected to the corresponding fourth control line 112(n,m) of the plurality of fourth control lines 112(1-N,1-M). An electrical behavior of the first control node and the third control node of an access device 110(n,m), e.g., each access device, may be controlled via the second control node. The electrical behavior may include an electrical resistance associated with an electrical current flow between the first control node and the third control node.

According to various aspects, the memory cell arrangement 100 may include a plurality of fourth control lines 112(1-N,1-M). In the following, the plurality of fourth control lines 112(1-N,1-M) may also be referred to as fourth control line set 112(1-N,1-M), sourcelines 112(1-N,1-M) or plurality of sourcelines 112(1-N,1-M). However, the term "sourceline" used with respect to the fourth control lines 112(1-N,1-M) may be chosen differently. The plurality of fourth control lines 112(1-N,1-M) may include a number of fourth control lines 112(n,m) equal to the fourth number, N×M. Each fourth control line 112(n,m) of the plurality of fourth control lines 112(1-N,1-M) may connect a respective first memory cell subset (of the plurality of first memory cell subsets) with the corresponding access device 110(n,m). For example, a fourth control line 112(n*,m*) connects the first memory cell subset associated to the access device 110(n*, m*) with the access device 110(n*,m*). According to various aspects, each access device 110(n,m) may be configured such that no continuous current flows from the corresponding first control line 104(n) to the corresponding fourth control line 112(n,m).

For example, a memory cell arrangement 100 of a three dimensional array type may be described by the first number, N, the second number, M, and the third number, P as described herein.

FIG. 1 exemplarily shows a memory cell arrangement 100 for N=2, M=2, and P=2, i.e., two first control lines 104(1-2) (e.g., two bitlines 104(1-2), such as a first bitline 104(1) and a second bitline 104(2)), two second control lines 106(1-2) (e.g., two wordlines 106(1-2), such as a first wordline 106(1) and a second wordline 106(2)), and two third control lines 108(1-2) (e.g., two platelines 108(1-2), such as a first plateline 108(1) and a second plateline 108(2)).

The plurality of memory cell sets 102(1-2) may include a first memory cell set 102(1) and a second memory cell set 102(2). The first memory cell set 102(1) may include a first memory cell 2(1,1,1), a second memory cell 2(1,1,2), a third memory cell 2(1,2,1), and a fourth memory cell 2(1,2,2). The second memory cell set 102(2) may include a first memory cell 2(2,1,1), a second memory cell 2(2,1,2), a third memory cell 2(2,2,1), and a fourth memory cell 2(2,2,2). For example, the first memory cell 2(2,1,1) of the second memory cell set 102(2) may be a fifth memory cell 2(2,1,1), the second memory cell 2(2,1,2) of the second memory cell set 102(2) may be a sixth memory cell 2(2,1,2), the third memory cell 2(2,2,1) of the second memory cell set 102(2) may be a seventh memory cell 2(2,2,1), and the fourth memory cell 2(2,2,2) of the second memory cell set 102(2) may be an eighth memory cell 2(2,2,2).

The plurality of first memory cell subsets may include the first memory cell subset including the memory cells 2(1,1, 1-2) and the additional first memory cell subset 2(1,2,1-2). The plurality of second memory cell subsets may include the second memory cell subset 2(1,1-2,1) and the additional second memory cell subset 2(1,1-2,2).

The first bitline 104(1) may be assigned to the first memory cell 2(1,1,1), the second memory cell 2(1,1,2), the third memory cell 2(1,2,1), and the fourth memory cell 2(1,2,2). The second bitline 104(2) may be assigned to the fifth memory cell 2(2,1,1), the sixth memory cell 2(2,1,2), the seventh memory cell 2(2,2,1), and the eighth memory cell 2(2,2,2). The first wordline 106(1) may be assigned to the first memory cell 2(1,1,1), the second memory cell 2(1,1,2), the fifth memory cell 2(2,1,1) and the sixth memory cell 2(2,1,2). The second wordline 106(2) may be assigned to the third memory cell 2(1,2,1), the fourth memory cell 2(1,2,2), the seventh memory cell 2(2,2,1) and the eighth memory cell 2(2,2,2). The first plateline 108(1) may be assigned to the first memory cell 2(1,1,1), the third memory cell 2(1,2,1), the fifth memory cell 2(2,1,1) and the seventh memory cell 2(2,2,1). The second plateline 108(2) may be assigned to the second memory cell 2(1,1,2), the fourth memory cell 2(1,2,2), the sixth memory cell 2(2,1,2) and the eighth memory cell 2(2,2,2).

The plurality of access devices 110(1-2,1-2) may include a first access device 110(1,1), a second access device 110 (1,2), a third access device 110(2,1), and a fourth access device 110(2,2). The first wordline 106(1) may be configured to control the first access device 110(1,1) to connect the first bitline 104(1) to the first memory cell 2(1,1,1) and the second memory cell 2(1,1,2). For example, the first access device 110(1,1) may connect the first memory cell 2(1,1,1) and the second memory cell 2(1,1,2) to the first bitline 104(1) controlled by the first wordline 106(1). The first wordline 106(1) may be further configured to control the third access device 110(2,1) to connect the second bitline 104(2) to the fifth memory cell 2(2,1,1) and the sixth memory cell 2(2,1,2). For example, the third access device 110(2,1) may connect the fifth memory cell 2(2,1,1) and the sixth memory cell 2(2,1,2) to the second bitline 104(2) controlled by the first wordline 106(1). The second wordline 106(2) may be configured to control the second access device 110(1,2) to connect the second bitline 104(2) to the third memory cell 2(1,2,1) and the fourth memory cell 2(1,2,2). For example, the second access device 110(1,2) may connect the third memory cell 2(1,2,1) and the fourth memory cell 2(1,2,2) to the second bitline 104(2) controlled by the second wordline 106(2). The second wordline 106(2) may be further configured to control the fourth access device 110(2,2) to connect the second bitline 104(2) to the seventh memory cell 2(2,2,1) and the eighth memory cell 2(2,2,2). For example, the fourth access device 110(2,2) may connect the seventh memory cell 2(2,2,1) and the eighth memory cell 2(2,2,2) to the second bitline 104(2) controlled by the second wordline 106(2).

Figure 2:
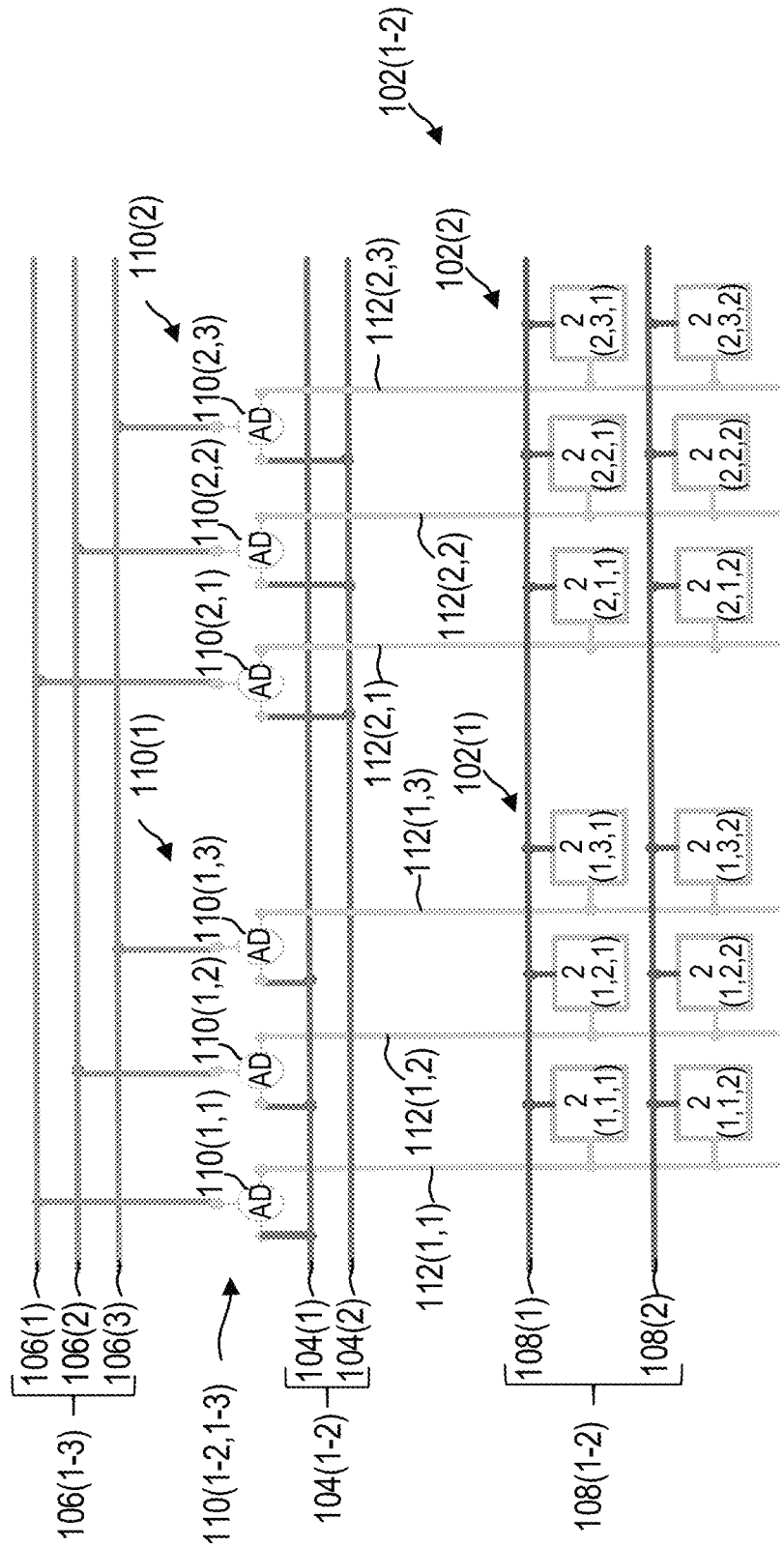
FIG. 2 schematically shows an exemplary memory cell arrangement including 12 memory cells, according to various aspects.
Figure 3:
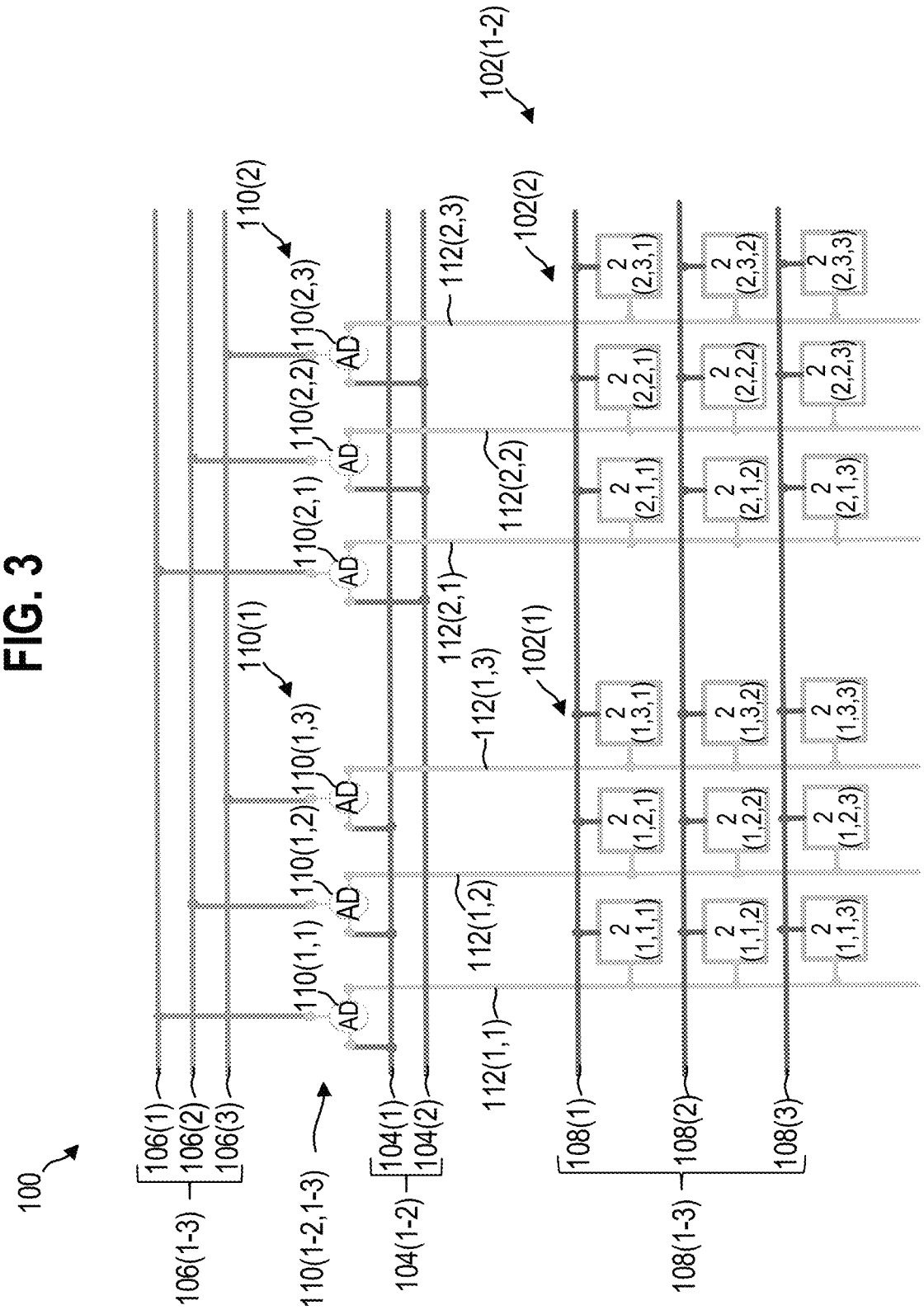
FIG. 3 schematically shows an exemplary memory cell arrangement including 18 memory cells, according to various aspects.
Figure 4:
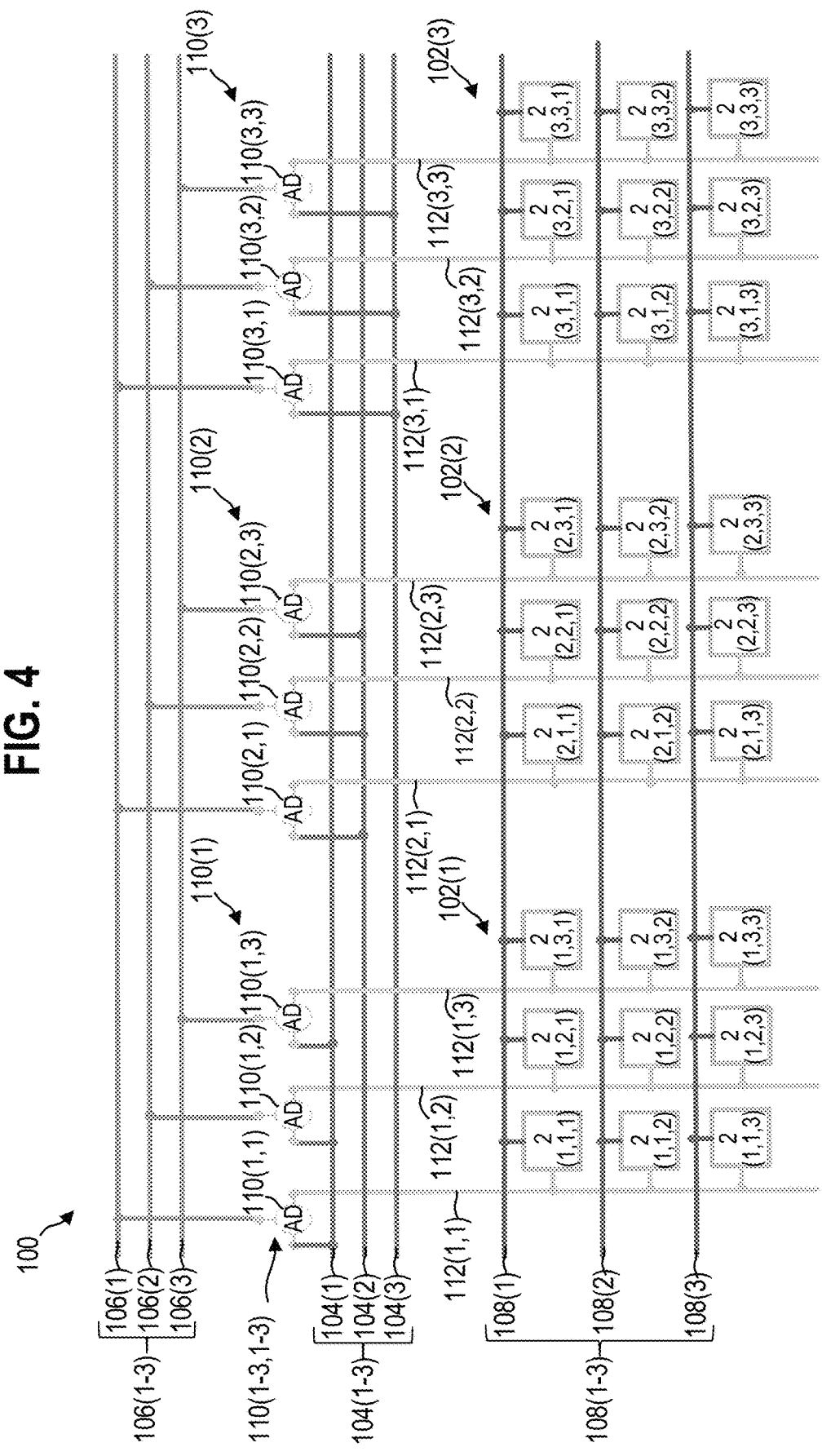
FIG. 4 schematically shows an exemplary memory cell arrangement including 27 memory cells, according to various aspects.

In a similar way as described above, FIG. 2 illustrates schematically an exemplary configuration of a memory cell arrangement 100 for N=2, M=3, and P=2, according to various aspects; FIG. 3 illustrates schematically an exemplary configuration of a memory cell arrangement 100 for N=2, M=3, and P=3, according to various aspects; and FIG. 4 illustrates schematically an exemplary configuration of a memory cell arrangement 100 for N=3, M=3, and P=3, according to various aspects.

It is understood that other configurations of a memory cell arrangement 100 may be configured in the same or in a similar way for N greater 2, M greater 3, and/or P greater 3, according to various aspects.

Figure 5B:
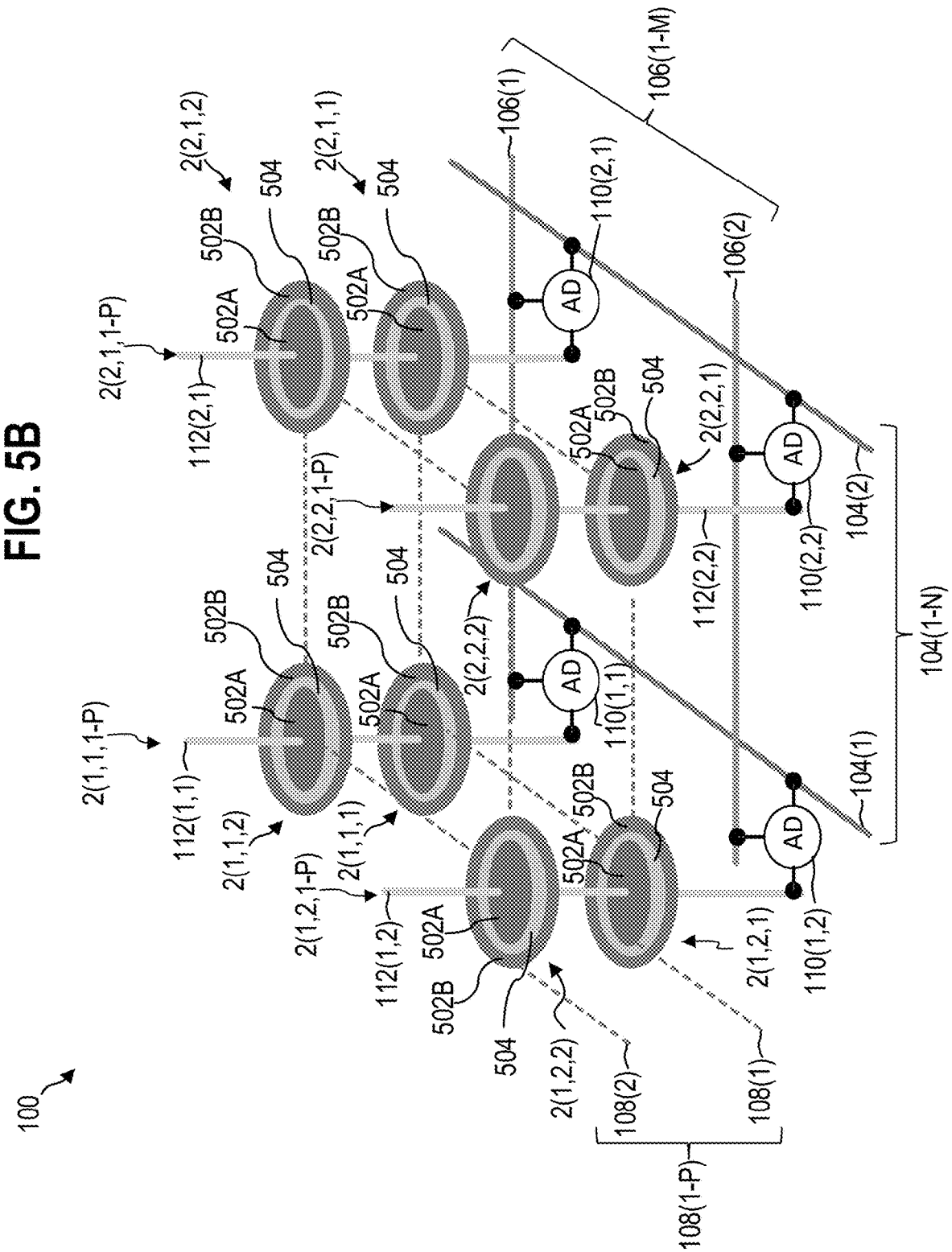
FIG. 5B schematically shows a perspective view of a capacitor-based memory cell arrangement, according to various aspects.

FIG. 5A illustrates schematically an exemplary configuration of a capacitor-based memory cell arrangement 100 according to various aspects. FIG. 5B illustrates schematically a perspective view of a capacitor-based memory cell arrangement 100 according to various aspects. The capacitor-based memory cell arrangement 100 may correspond substantially to the memory cell arrangement 100, wherein each memory cell 2(n,m,p) of the plurality of memory cells 2(1-N,1-M,1-P) is a capacitor-based memory cell 2(n,m,p).

According to various aspects, each capacitor-based memory cell 2(n,m,p) may include a first electrode portion 502A and a second electrode portion 502B. The first electrode portion 502A may be or may include a first electrode of a capacitor and the second electrode portion 502B may be or may include a second electrode of the capacitor. According to various aspects, a remanent-polarizable portion may be arranged between the first electrode portion 502A and the second electrode portion 502B of each capacitor-based memory cell 2(n,m,p) of the plurality of memory cells 2(1-N,1-M,1-P). The remanent-polarizable portion together with the adjacent first electrode portion 502A and second electrode portion 502B forms, in some aspects, a FeCAP that can be used as memory cell. According to various aspects, the first electrode portion 502A may include a first metallic material (e.g., a metal, e.g., a metal alloy), a first degenerated semiconductor material, or at least no semiconducting material. According to various aspects, the second electrode portion 502B may include a second metallic material (e.g., a metal, e.g., a metal alloy, e.g., the same metallic material as the first metallic material, e.g., a different metallic material than the first metallic material), a second degenerated semiconductor material (e.g., the same degenerated semiconductor material as the first degenerated semiconductor material, e.g., a different degenerated semiconductor material than the first degenerated semiconductor material) or at least no semiconducting material. According to various aspects, the first electrode portion 502A, the remanent-polarizable portion, and the second electrode portion 502B may form a stack structure including the first metallic material, a remanent-polarizable material in physical contact with the first metallic material, and the second metallic material in physical contact with the remanent-polarizable material.

Each first electrode portion 502A of a respective memory cell 2(n,m,p) may be connected (e.g., electrically conductively connected) to the corresponding access device 110(n, m). For example, the respective first electrode portions 502A of the memory cells 2(n*,m*,1-P) may be electrically conductively connected to the corresponding access device 110(n*,m*). For each first memory cell subset (e.g., the first memory cell subset or the plurality of first memory cell subsets), each first electrode portion 502A of the memory cells of a respective first memory cell subset may be connected (e.g., electrically conductively connected) to the corresponding access device 110(n,m) via the corresponding forth control line 112(n,m). For example, for the first memory cell subset including the memory cells 2(n*,m*,1-P), each first electrode portion 502A of a respective memory cell 2(n*,m*,p) may be connected (e.g., electrically conductively connected) to the corresponding access device 110 (n*,m*) via the corresponding forth control line 112(n*,m*).

Each second electrode portion 502B of a respective memory cell 2(n,m,p) may be connected (e.g., electrically conductively connected) to the corresponding third control line 108(p) of the plurality of third control lines 108(1-P). For example, each second electrode portion 502B of the memory cells 2(1-N,1-M,p*) may be connected (e.g., electrically conductively connected) to the corresponding third control line 108(p*).

According to various aspects, the second electrode portions 502B of respective one or more memory cells 2(n,m,p) may at least partially surround (e.g., completely surround) the corresponding first electrode portion 502A. For example, each second electrode portion 502B of the memory cells 2(1-N,1-M,p*) sharing a common third control line 108(p*) may at least partially surround (e.g., completely surround) the corresponding first electrode portions 502A of the memory cells 2(1-N,1-M,p*). For example, each second electrode portion 502B of each memory cell 2(n,m,p) of the plurality of memory cells 2(1-N,1-M,1-P) may at least partially surround (e.g., completely surround) the corresponding first electrode portions 502A.

According to various aspects, the first electrode portions 502A of all memory cells of each first memory cell subset may be part of or may provide a common first electrode 802A. For example, the first electrode portions 502A of the memory cells 2(n*,m*,1-P) of a respective first memory cell subset may be part of or may provide a common first electrode 802A. A common first electrode (e.g., each common first electrode) 802A may be configured as the corresponding fourth control line 112(n*,m*). A common first electrode (e.g., each common first electrode) 802A may connect (e.g., electrically conductively connect) each memory cell 2(n*,m*1-P) of the respective first memory cell subset to the corresponding access device 110(n*,m*). A common first electrode (e.g., each common first electrode) 802A may include an elongated shape (e.g., an oblong shape, a pillar shape, a tube shape). A common first electrode (e.g., each common first electrode) 802A may include an elongated shape with a base geometry of one of the following: a circle, a triangle, a square, a parallelogram, a trapezoid, an ellipse, a polygon, etc. See, for example, FIGS. 8A and 8B that illustrate exemplary memory cell arrangements 800a, 800b having memory cells that share a common first electrode 802A and a common second electrode 802B.

According to various aspects, the second electrode portions 502B (all second electrode portions) of all memory cells of each second memory cell subset may be part of or may provide a common second electrode 802B. For example, the second electrode portions 502B of the memory cells 2(n*,1-M,p*) of a respective second memory cell subset may be part of or may provide a common second electrode 802B.

According to various aspects, the second electrode portions 502B of all memory cells that share a third control line 108(p) of the plurality of third control lines 108(1-P) may be part of or may provide a common second electrode 802B. For example, all memory cells 2(1-N,1-M,p*) that share the third control line 108(p*) may be part of or may provide a common second electrode 802B. The common second electrode portion 502B may be (e.g., electrically conductively) connected to the corresponding third control line 108(p). A common second electrode (e.g., each common second electrode) 802B may include a plate shape. A common second electrode (e.g., each common second electrode) 802B may at least partially (e.g., completely) surround the first electrode portions 502A of the corresponding memory cells. For example, a third control line may be or may include a common second electrode and/or a common second electrode may be configured as a third control line.

For example, each capacitor-based memory cell 2(n,m,p) may be a ferroelectric capacitor-based memory cell 2(n,m,p), e.g., a FeCAP. The memory cell arrangement 100 may include or may be part of a non-volatile ferroelectric (capacitor-based) memory cell arrangement, such as a ferroelectric random access memory (FeRAM). As shown in FIG. 5B, a ferroelectric portion 504 (e.g., a ferroelectric layer) may be arranged between the first electrode portion 502A and the second electrode portion 502B of each ferroelectric capacitor-based memory cell 2(n,m,p) of the plurality of memory cells 2(1-N,1-M,1-P).

According to various aspects, the memory cells associated to a common first electrode (e.g., each common first electrode) 802A may include a common ferroelectric portion 504. According to various aspects, all memory cells that share a fourth control line 112(n,m) of the plurality of fourth control lines 112(1-N,1-M) may include a common ferroelectric portion 504, such as a continuous ferroelectric layer). For example, the memory cells 2(n*,m*1-P) sharing a fourth control line 112(n*,m*) may include a common ferroelectric layer 804.

The ferroelectric portion 504 (e.g., the ferroelectric portion or the common ferroelectric layer) of each memory cell 2(n,m,p) may at least partially surround (e.g., completely surround, preferably completely perimeterally surround) the corresponding first electrode 502A. The ferroelectric portion 504 may have a curved shape and may fill a gap between the adjacent first and second electrode portions.

Figure 6:
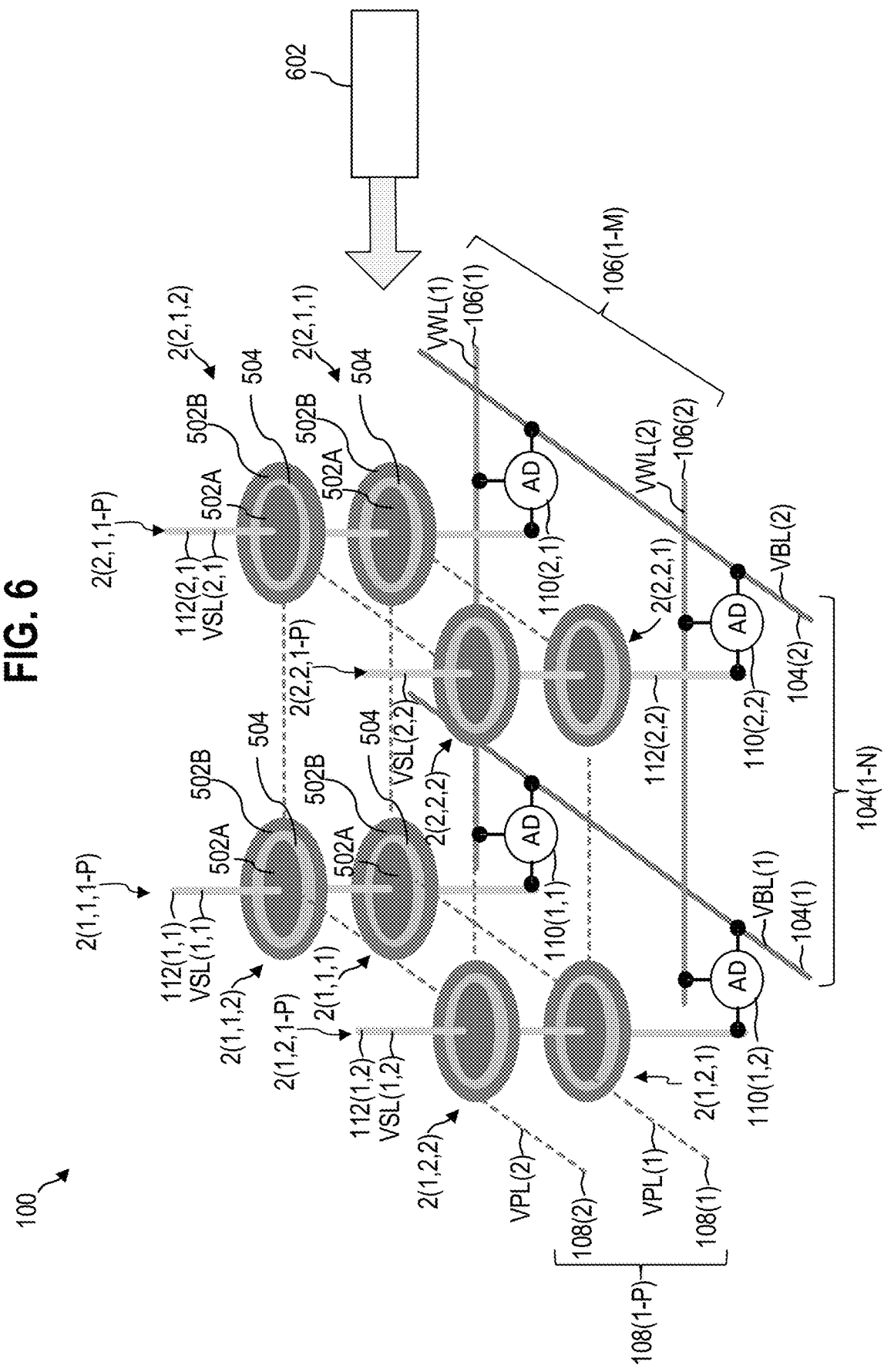
FIG. 6 shows a perspective view of a ferroelectric memory cell arrangement driven by one or more control circuits, according to various aspects.

FIG. 6 illustrates schematically a perspective view of a memory cell arrangement 100 driven by one or more control circuits 602, according to various aspects.

The one or more control circuits 602 may include a write control circuit. The write control circuit may be configured to write (e.g., to program and/or erase) one of the memory cells 2(n,m,p), such as the memory cell 2(n*,m*,p*). The write control circuit may be configured to supply (e.g., to apply) one or more voltages VBL(1-N) to the plurality of first control lines 104(1-N). The write control circuit may be configured to supply one or more voltages VWL(1-M) to the plurality of second control lines 106(1-M). The write control circuit may be configured to supply one or more voltages VPL(1-P) to the plurality of third control lines 108(1-P). The write control circuit may be configured to supply one or more voltages VBL(1-N) to the plurality of first control lines 104(1-N), one or more voltages VWL(1-M) to the plurality of second control lines 106(1-M), and one or more voltages VPL(1-P) to the plurality of third control lines 108(1-P) such that a memory cell to be written 2(n*,m*,p*) is written and other one or more memory cells 2((n,m,p)\(n*,m*,p*)) are not written (i.e., one or more memory cells 2(n,m,p) except for the memory cell to be written 2(n*,m*,p*)).

The memory cell to be written 2(n*,m*,p*) may be associated to a first control line 104(n*) of the plurality of first control lines 104(1-N). The memory cell to be written 2(n*,m*,p*) may be associated to a second control line 106(m*) of the plurality of second control lines 106(1-M). The memory cell to be written 2(n*,m*,p*) may be associated to a third control line 108(p*) of the plurality of third control lines 108(1-P). The write control circuit may be configured to write the memory cell to be written 2(n*,m*,p*) by supplying (e.g., applying) a first voltage VBL(n*) to the associated first control line 104(n*), a second voltage VWL(m*) to the associated second control line 106(m*), and a third voltage VPL(p*) to the associated third control line 108(p*).

According to various aspects, the write control circuit may be further configured to supply (e.g., apply) another first voltage (e.g., a first inhibit voltage) VBL(n\n*) to one or more other first control lines 104(n\n*). The write control circuit may be further configured to supply (e.g., apply) another second voltage (e.g., a second inhibit voltage) VWL(m\m*) to one or more other second control lines 106(m\m*). The write control circuit may be further configured to supply (e.g., apply) another third voltage (e.g., a third inhibit voltage) VPL(p\p*) to one or more other third control lines 108(p\p*).

As described above, each access device 110(n,m) of the plurality of access devices 110(1-N,1-M) may be associated to a first control line 104(n) of the plurality of first control lines 104(1-N) and a second control line 106(m) of the plurality of second control lines 106(1-M). Each memory cell 2(n,m,p) may be associated to an access device 110(n,m) of the plurality of access devices.

The write control circuit may be configured to supply (e.g., apply), for each access device 110((n,m)\(n*,m*)) of the plurality of access devices 110(1-N,1-M) not associated to the memory cell to be written 2(n*,m*,p*), a first inhibit voltage VBL(n\n*) to the corresponding first control line or first control lines 104(n\n*) and a second inhibit voltage VWL(m\m*) to the corresponding second control line or second control lines 106(m\m*) such that a connection between the corresponding first control 104(n\n*) and the memory cells of the corresponding first memory cell subset (not including the memory cell to be written 2(n*,m*,p*)) is prohibited.

The write control circuit may be configured to supply (e.g., apply) a third inhibit voltage VPL(p\p*) to the respective third control line or third control lines 108(p\p*) such that all memory cells 2(1-N,1-M,p\p*) sharing a respective third control line 108(p\p*) of the one or more other third control lines 108(1-P\p*) do not change into another of the at least two memory states of the respective memory cell. For example, the memory cells 2(n\n*,m\m*,1-P) of a first memory cell subset associated to an access device 110((n,m)\(n*,m*)), for which a connection to the respective first control line 104(n\n*) is prohibited, a floating potential may occur. The third inhibit voltage VPL(p\p*) supplied to the respective third control line 108(p\p*) may be higher (e.g., at least ten times higher) than the occurring floating potential.

According to various aspects, the memory cell to be written 2(n*,m*,p*) may be further associated to a fourth control line 112(n*,m*) of the plurality of fourth control lines 112(1-N,1-M). The write control circuit may be further configured to supply (e.g., apply) one or more fourth voltages VSL(1-N,1-M) (e.g., a fourth voltage, e.g., one or more fourth inhibit voltages) to one or more fourth control lines 112((n,m)\(n*,m*)) not associated with the memory cell to be written 2(n*,m*,p*) (e.g., all fourth control lines 112(1-N,1-M)\(n*,m*)) not associated with the memory cell to be written 2(n*,m*,p*)).

For example, writing the memory cell to be written 2(n*,m*,p*) may include programming the memory cell 2(n*,m*,p*) and the absolute value of the difference between the first voltage VBL(n*) applied to the associated first control line 104(n*) (of the memory cell to be written 2(n*,m*,p*)) and the third voltage VPL(p*) applied to the associated third control line 108(p*) may be larger than the absolute value of a coercive voltage of the ferroelectric portion 504.

As an example with respect to FIG. 6, the write control circuit may be configured to write the memory cell 2(1,1,1) by supplying (e.g., applying) a first voltage VBL(1) to the associated first control line 104(1), a second voltage VWL(1) to the associated second control line 106(1), and a third voltage VPL(1) to the associated third control line 108(1). The write control circuit may be further configured (e.g., during writing the memory cell to be written 2(1,1,1)) by supplying (e.g., applying) a first inhibit voltage VBL(2) to the the other first control line 104(2), a second inhibit voltage VWL(2) to the other second control line 106(2), and a third inhibit voltage VPL(2) to the other third control line 108(2). The write control circuit may be further configured (e.g., while writing the memory cell to be written 2(1,1,1)) by supplying (e.g., applying) a fourth inhibit voltage VSL(1,2) to the fourth control line 112(1,2), a fourth inhibit voltage VSL(2,1) to the fourth control line 112(2,1), and/or a fourth inhibit voltage VSL(2,2) to the fourth control line 112(2,2).

According to various aspects, each memory cell 2(n,m,p) of the plurality of memory cells 2(1-N,1-M,1-P) may include a respective ferroelectric portion 504. At each ferroelectric portion 504 a respective voltage may occur (e.g., indirectly applied depending on the applied voltages VBL(1-N), VWL(1-M), VPL(1-P), and/or VSL(1-N,1-M). The write control circuit may be configured to write the memory cell to be written 2(n*,m*,p*) and the voltage at the ferroelectric portion 504 of the memory cell to be written 2(n*,m*,p*) may be substantially equal to absolute value of the difference between the first voltage VBL(n*) applied to the associated first control line 104(n*) and the third voltage VPL(p*) applied to the associated third control line 108(p*). It is noted that the formulation "voltage at the ferroelectric portion" is used herein to include a voltage drop over and/or a voltage drop across the ferroelectric portion. The voltage at the ferroelectric portions 504 of the memory cells 2(n*,m*,1-P\p*) may be substantially equal to absolute value of the difference between the first voltage VBL(n*) applied to the associated first control line 104(n*) and the third inhibit voltage VPL(p\p*) applied to the other third control line or third control lines 108(p\p*). The fourth control line associated to an access device for which a second inhibit voltage VWL(m\m*) is supplied to the corresponding second control line 106(m\m*) may have a floating potential (e.g., the respective fourth control line may be floating), implying a high impedance. The voltage at the ferroelectric portions 504 of the memory cells 2(n*,1-M\m*,p*) may be about the absolute value of the difference between the third voltage VPL(p*) applied to the associated third control line 108(p*) and the third inhibit voltage VPL(p\p*) applied to the other third control line or third control lines 108(p\p*). The voltage at the ferroelectric portions 504 of the memory cells 2(n*,1-M\m*,1-P\p*) may have a voltage value of about 0V. The voltage at the ferroelectric portions 504 of the memory cells 2(1-N\n*,m*,p*) may be substantially equal to absolute value of the difference between the first inhibit voltage VBL(n\n*) applied to the other first control line or first control lines 104(n\n*) and the third voltage VPL(p*) applied to the corresponding third control line 108(p*). The voltage at the ferroelectric portions 504 of the memory cells 2(1-N\n*,m*,1-P\p*) may be substantially equal to absolute value of the difference between the first inhibit voltage VBL(n\n*) applied to the other first control line or first control lines 104(n\n*) and the third inhibit voltage VPL(p\p*) applied to the other third control line or third control lines 108(p\p*). The voltage at the ferroelectric portions 504 of the memory cells 2(1-N\n*,1-M\m*,p*) may be about the absolute value of the difference between the third voltage VPL(p*) applied to the associated third control line 108(p*) and the third inhibit voltage VPL(p\p*) applied to the other third control line or third control lines 108(p\p*). The voltage at the ferroelectric portions 504 of the memory cells 2(1-N\n*,1-M\m*,1-P\p*) may have a voltage value of about 0V.

According to an example, each access device 110(n,m) of the plurality of access devices 110(1-N,1-M) may include a respective field-effect transistor (e.g., an NFET) and the write control circuit may be configured to program the memory cell to be written 2(n*,m*,p*) by supplying (e.g., applying) a first voltage VBL(n*) having a voltage value of 2V to the associated first control line 104(n*), a second voltage VWL(m*) having a voltage value of 2.5V to the associated second control line 106(m*), and a third voltage VPL(p*) having a voltage value of 0V to the associated third control line 108(p*). The write control circuit may be further configured (e.g., during programming the memory cell to be written 2(n*,m*,p*)) to supply (e.g., apply) a first inhibit voltage VBL(n\n*) having a voltage value of 0V to the corresponding first control line or first control lines 104(n\n*), a second inhibit voltage VWL(m\m*) having a voltage value of 0V to the corresponding second control line or second control lines 106(m\m*), and/or a third inhibit voltage VPL(p\p*) having a voltage value of 1V to the corresponding third control line or third control lines 108(p\p*). Each memory cell 2(n,m,p) of the plurality of memory cells 2(1-N,1-M,1-P) may include a respective ferroelectric portion 504 and the voltage at the ferroelectric portion 504 of the memory cell to be programmed 2(n*,m*,p*) may have a voltage value of +2V, the voltage at the ferroelectric portions 504 of the memory cells 2(n*,m*,1-P\p*) may have a voltage value of +1V, the voltage at the ferroelectric portions 504 of the memory cells 2(n*,1-M\m*,p*) may have a voltage value of about +1V, the voltage at the ferroelectric portions 504 of the memory cells 2(n*,1-M\m*,1-P\p*) may have a voltage value of about 0V, the voltage at the ferroelectric portions 504 of the memory cells 2(1-N\n*,m*,p*) may have a voltage value of about 0V, the voltage at the ferroelectric portions 504 of the memory cells 2(1-N\n*,m*,1-P\p*) may have a voltage value of about +1V, the voltage at the ferroelectric portions 504 of the memory cells 2(1-N\n*,1-M\m*,p*) may have a voltage value of about +1V, and/or the voltage at the ferroelectric portions 504 of the memory cells 2(1-N\n*,1-M\m*,1-P\p*) may have a voltage value of about 0V. According to some aspects, and the voltage at the ferroelectric portion 504 of the memory cell to be programmed 2(n*,m*,p*) may have a voltage value of +2V, the voltage at the ferroelectric portions 504 of the memory cells 2(n*,m*,1-P\p*) may have a voltage value of +1V, the voltage at the ferroelectric portions 504 of the memory cells 2(n*,1-M\m*,p*) may have a voltage value of about +1V, the voltage at the ferroelectric portions 504 of the memory cells 2(n*,1-M\m*,1-P\p*) may have a voltage value of about 0V, the voltage at the ferroelectric portions 504 of the memory cells 2(1-N\n*,m*,p*) may have a voltage value of about +1V, the voltage at the ferroelectric portions 504 of the memory cells 2(1-N\n*,m*,1-P\p*) may have a voltage value of about 0V, the voltage at the ferroelectric portions 504 of the memory cells 2(1-N\n*,1-M\m*,p*) may have a voltage value of about +1V, and/or the voltage at the ferroelectric portions 504 of the memory cells 2(1-N\n*,1-M\m*,1-P\p*) may have a voltage value of about 0V.

According to an example, each access device 110(n,m) of the plurality of access devices 110(1-N,1-M) may include a respective transmission gate and the write control circuit may be configured to program the memory cell to be written 2(n*,m*,p*) by supplying (e.g., applying) a first voltage VBL(n*) having a voltage value of 1V to the associated first control line 104(n*), a second voltage VWL(m*) having a voltage value of 1.5V to the associated second control line 106(m*), and a third voltage VPL(p*) having a voltage value of −1V to the associated third control line 108(p*). The write control circuit may be further configured (e.g., during programming the memory cell to be written 2(n*,m*,p*)) to supply (e.g., apply) a first inhibit voltage VBL(n\n*) having a voltage value of 0V to the corresponding first control line or first control lines 104(n\n*), a second inhibit voltage VWL(m\m*) having a voltage value of 0V to the corresponding second control line or second control lines 106(m\m*), and/or a third inhibit voltage VPL(p\p*) having a voltage value of 0V to the corresponding third control line or third control lines 108(p\p*). Each memory cell 2(n,m,p) of the plurality of memory cells 2(1-N,1-M,1-P) may include a respective ferroelectric portion 504 and the voltage at the ferroelectric portion 504 of the memory cell to be programmed 2(n*,m*,p*) may have a voltage value of +2V, the voltage at the ferroelectric portions 504 of the memory cells 2(n*,m*,1-P\p*) may have a voltage value of +1V, the voltage at the ferroelectric portions 504 of the memory cells 2(n*,1-M\m*,p*) may have a voltage value of about +1V, the voltage at the ferroelectric portions 504 of the memory cells 2(n*,1-M\m*,1-P\p*) may have a voltage value of about 0V, the voltage at the ferroelectric portions 504 of the memory cells 2(1-N\n*,m*,p*) may have a voltage value of about +1V, the voltage at the ferroelectric portions 504 of the memory cells 2(1-N\n*,m*,1-P\p*) may have a voltage value of about 0V, the voltage at the ferroelectric portions 504 of the memory cells 2(1-N\n*,1-M\m*,p*) may have a voltage value of about +1V, and/or the voltage at the ferroelectric portions 504 of the memory cells 2(1-N\n*,1-M\m*,1-P\p*) may have a voltage value of about 0V.

According to an example, each access device 110(n,m) of the plurality of access devices 110(1-N,1-M) may include a respective field-effect transistor (e.g., an NFET) and the write control circuit may be configured to erase the memory cell to be written 2(n*,m*,p*) by supplying (e.g., applying) a first voltage VBL(n*) having a voltage value of 0V to the associated first control line 104(n*), a second voltage VWL(m*) having a voltage value of 2.5V to the associated second control line 106(m*), and a third voltage VPL(p*) having a voltage value of 2V to the associated third control line 108(p*). The write control circuit may be further configured (e.g., during erasing the memory cell to be written 2(n*,m*, p*)) to supply (e.g., apply) a first inhibit voltage VBL(n\n*) having a voltage value of 0V to the corresponding first control line or first control lines 104(n\n*), a second inhibit voltage VWL(m\m*) having a voltage value of 0V to the corresponding second control line or second control lines 106(m\m*), and/or a third inhibit voltage VPL(p\p*) having a voltage value of 1V to the corresponding third control line or third control lines 108(p\p*). Each memory cell 2(n,m,p) of the plurality of memory cells 2(1-N,1-M,1-P) may include a respective ferroelectric portion 504 and the voltage at the ferroelectric portion 504 of the memory cell to be erased 2(n*,m*,p*) may have a voltage value of −2V, the voltage at the ferroelectric portions 504 of the memory cells 2(n*,m*,1-P\p*) may have a voltage value of −1V, the voltage at the ferroelectric portions 504 of the memory cells 2(n*,1-M\m*,p*) may have a voltage value of about −1V, the voltage at the ferroelectric portions 504 of the memory cells 2(n*,1-M\m*,1-P\p*) may have a voltage value of about 0V, the voltage at the ferroelectric portions 504 of the memory cells 2(1-N\n*,m*,p*) may have a voltage value of about 0V, the voltage at the ferroelectric portions 504 of the memory cells 2(1-N\n*,m*,1-P\p*) may have a voltage value of about −1V, the voltage at the ferroelectric portions 504 of the memory cells 2(1-N\n*,1-M\m*,p*) may have a voltage value of about −1V, and/or the voltage at the ferroelectric portions 504 of the memory cells 2(1-N\n*,1-M\m*,1-P\p*) may have a voltage value of about 0V.

According to an example, each access device 110(n,m) of the plurality of access devices 110(1-N,1-M) may include a respective transmission gate and the write control circuit may be configured to erase the memory cell to be written 2(n*,m*,p*) by supplying (e.g., applying) a first voltage VBL(n*) having a voltage value of −1V to the associated first control line 104(n*), a second voltage VWL(m*) having a voltage value of 1.5V to the associated second control line 106(m*), and a third voltage VPL(p*) having a voltage value of 1V to the associated third control line 108(p*). The write control circuit may be further configured (e.g., during erasing the memory cell to be written 2(n*,m*,p*)) to supply (e.g., apply) a first inhibit voltage VBL(n\n*) having a voltage value of 0V to the corresponding first control line or first control lines 104(n\n*), a second inhibit voltage VWL (m\m*) having a voltage value of 0V to the corresponding second control line or second control lines 106(m\m*), and/or a third inhibit voltage VPL(p\p*) having a voltage value of 0V to the corresponding third control line or third control lines 108(p\p*). Each memory cell 2(n,m,p) of the plurality of memory cells 2(1-N,1-M,1-P) may include a respective ferroelectric portion 504 and the voltage at the ferroelectric portion 504 of the memory cell to be erased 2(n*,m*,p*) may have a voltage value of −2V, the voltage at the ferroelectric portions 504 of the memory cells 2(n*,m*, 1-P\p*) may have a voltage value of −1V, the voltage at the ferroelectric portions 504 of the memory cells 2(n*,1-M\m*, p*) may have a voltage value of about −1V, the voltage at the ferroelectric portions 504 of the memory cells 2(n*,1-M\m*, 1-P\p*) may have a voltage value of about 0V, the voltage at the ferroelectric portions 504 of the memory cells 2(1-N\n*,m*,p*) may have a voltage value of about −1V, the voltage at the ferroelectric portions 504 of the memory cells 2(1-N\n*,m*,1-P\p*) may have a voltage value of about 0V, the voltage at the ferroelectric portions 504 of the memory cells 2(1-N\n*,1-M\m*,p*) may have a voltage value of about −1V, and/or the voltage at the ferroelectric portions 504 of the memory cells 2(1-N\n*,1-M\m*,1-P\p*) may have a voltage value of about 0V.

The one or more control circuits 602 may include a read control circuit. The read control circuit may be configured to read out one of the memory cells 2(n,m,p), such as the memory cell 2(n*,m*,p*). According to various aspects, reading the memory cell to be read out 2(n*,m*,p*) may include erasing (or programming) the memory cell to be read out 2(n*,m*,p*). The read control circuit may be configured to supply one or more voltages VBL(1-N) to the plurality of first control lines 104(1-N). The read control circuit may be configured to supply one or more voltages VWL(1-M) to the plurality of second control lines 106(1-M). The read control circuit may be configured to supply one or more voltages VPL(1-P) to the plurality of third control lines 108(1-P). The read control circuit may be configured to supply one or more voltages VBL(1-N) to the plurality of first control lines 104(1-N), one or more voltages VWL(1-M) to the plurality of second control lines 106(1-M), and one or more voltages VPL(1-P) to the plurality of third control lines 108(1-P). The read control circuit may be configured to detect (e.g., using a sensing amplifier) a potential difference between the corresponding first control line 104(n*) and a reference potential such that a memory cell to be read out 2(n*,m*,p*) is read out and other one or more memory cells 2((n,m,p)\(n*,m*,p*)) are not read out (i.e., one or more memory cells 2(n,m,p) except for the memory cell to be read out 2(n*,m*,p*)). For example, a polarization-switch from a first polarization to a second polarization of the remanent-polarizable portion (e.g., the ferroelectric portion) (or vice versa) may lead to an increasing potential difference. For example, a potential difference may be higher if a polarization-switch occurs compared to no polarization-switch.

The memory cell to be read out 2(n*,m*,p*) may be associated to a first control line 104(n*) of the plurality of first control lines 104(1-N). The memory cell to be read out 2(n*,m*,p*) may be associated to a second control line 106(m*) of the plurality of second control lines 106(1-M). The memory cell to be read out 2(n*,m*,p*) may be associated to a third control line 108(p*) of the plurality of third control lines 108(1-P). The read control circuit may be configured to read out the memory cell to be read out 2(n*,m*,p*) by supplying (e.g., applying) a first voltage VBL(n*) to the associated first control line 104(n*), a second voltage VWL(m*) to the associated second control line 106(m*), and a third voltage VPL(p*) to the associated third control line 108(p*), and by detecting the potential difference between the corresponding first control line 104(n*) and the reference potential.

According to various aspects, the read control circuit may be further configured to supply (e.g., apply) another first voltage (e.g., a first inhibit voltage) VBL(n\n*) to one or more other first control lines 104(n\n*). The read control circuit may be further configured to supply (e.g., apply) another second voltage (e.g., a second inhibit voltage) VWL(m\m*) to one or more other second control lines 106(m\m*). The read control circuit may be further configured to supply (e.g., apply) another third voltage (e.g., a third inhibit voltage) VPL(p\p*) to one or more other third control lines 108(p\p*).

As described above, each access device 110(n,m) of the plurality of access devices 110(1-N,1-M) may be associated to a first control line 104(n) of the plurality of first control lines 104(1-N) and a second control line 106(m) of the plurality of second control lines 106(1-M). Each memory cell 2(n,m,p) may be associated to an access device 110(n,m) of the plurality of access devices.

The read control circuit may be configured to supply (e.g., apply), for each access device 110((n,m)\(n*,m*)) of the plurality of access devices 110(1-N,1-M) not associated to the memory cell to be read out 2(n*,m*,p*), a first inhibit voltage VBL(n\n*) to the corresponding first control line or first control lines 104(n\n*) and a second inhibit voltage VWL(m\m*) to the corresponding second control line or second control lines 106(m\m*) such that a connection between the corresponding first control 104(n\n*) and the memory cells of the corresponding first memory cell subset (not including the memory cell to be read out 2(n*,m*,p*)) is prohibited.

The read control circuit may be configured to supply (e.g., apply) a third inhibit voltage VPL(p\p*) to the respective third control line or third control lines 108(p\p*) such that all memory cells 2(1-N,1-M,p\p*) sharing a respective third control line 108(p\p*) of the one or more other third control lines 108(1-P\p*) do not change into another of the at least two memory states of the respective memory cell. For example, the memory cells 2(n\n*,m\m*,1-P) of a first memory cell subset associated to an access device 110((n, m)\(n*,m*)), for which a connection to the respective first control line 104(n\n*) is prohibited, a floating potential may occur. The third inhibit voltage VPL(p\p*) supplied to the respective third control line 108(p\p*) may be higher (e.g., at least ten times higher) than the occurring floating potential.

According to various aspects, the memory cell to be read out 2(n*,m*,p*) may be further associated to a fourth control line 112(n*,m*) of the plurality of fourth control lines 112(1-N,1-M). The read control circuit may be further configured to supply (e.g., apply) one or more fourth voltages VSL(1-N,1-M) (e.g., a fourth voltage, e.g., one or more fourth inhibit voltages) to one or more fourth control lines 112((n,m)\(n*,m*)) not associated with the memory cell to be read out 2(n*,m*,p*) (e.g., all fourth control lines 112((1-N,1-M)\(n*,m*)) not associated with the memory cell to be read out 2(n*,m*,p*)).

The absolute value of the difference between the first voltage VBL(n*) applied to the associated first control line 104(n*) (of the memory cell to be read out 2(n*,m*,p*)) and the third voltage VPL(p*) applied to the associated third control line 108(p*) may be larger than the absolute value of a coercive voltage of the ferroelectric portion 504.

As an example with respect to FIG. 6, the read control circuit may be configured to write the memory cell 2(1,1,1) by supplying (e.g., applying) a first voltage VBL(1) to the associated first control line 104(1), a second voltage VWL(1) to the associated second control line 106(1), and a third voltage VPL(1) to the associated third control line 108(1). The read control circuit may be further configured (e.g., during reading the memory cell to be read out 2(1,1,1)) by supplying (e.g., applying) a first inhibit voltage VBL(2) to the other first control line 104(2), a second inhibit voltage VWL(2) to the other second control line 106(2), and a third inhibit voltage VPL(2) to the other third control line 108(2). The read control circuit may be further configured (e.g., while reading the memory cell to be read out 2(1,1,1)) by supplying (e.g., applying) a fourth inhibit voltage VSL(1,2) to the fourth control line 112(1,2), a fourth inhibit voltage VSL(2,1) to the fourth control line 112(2,1), and/or a fourth inhibit voltage VSL(2,2) to the fourth control line 112(2,2).

According to various aspects, each memory cell 2(n,m,p) of the plurality of memory cells 2(1-N,1-M,1-P) may include a respective ferroelectric portion 504. At each ferroelectric portion 504 a respective voltage may occur (e.g., indirectly applied depending on the applied voltages VBL(1-N), VWL(1-M), VPL(1-P), and/or VSL(1-N,1-M). The read control circuit may be configured to read out the memory cell to be read out 2(n*,m*,p*) and the voltage at the ferroelectric portion 504 of the memory cell to be read out 2(n*,m*,p*) may be substantially equal to absolute value of the difference between the first voltage VBL(n*) applied to the associated first control line 104(*n*\*) and the third voltage VPL(p\*) applied to the associated third control line 108(*p*\*). The voltage at the ferroelectric portions 504 of the memory cells 2(n\*,m\*,1-P\p\*) may be substantially equal to absolute value of the difference between the first voltage VBL(n\*) applied to the associated first control line 104(*n*\*) and the third inhibit voltage VPL(p\p\*) applied to the other third control line or third control lines 108(*p\p*\*). The voltage at the ferroelectric portions 504 of the memory cells 2(n\*,1-M\m\*,p\*) may be about the absolute value of the difference between the third voltage VPL(p\*) applied to the associated third control line 108(*p*\*) and the third inhibit voltage VPL(p\p\*) applied to the other third control line or third control lines 108(*p\p*\*). The voltage at the ferroelectric portions 504 of the memory cells 2(n\*,1-M\m\*,1-P\p\*) may have a voltage value of about 0V. The voltage at the ferroelectric portions 504 of the memory cells 2(1-N\n\*,m\*, p\*) may be substantially equal to absolute value of the difference between the first inhibit voltage VBL(n\n\*) applied to the other first control line or first control lines 104(*n\n*\*) and the third voltage VPL(p\*) applied to the corresponding third control line 108(*p*\*). The voltage at the ferroelectric portions 504 of the memory cells 2(1-N\n\*,m\*, 1-P\p\*) may be substantially equal to absolute value of the difference between the first inhibit voltage VBL(n\n\*) applied to the other first control line or first control lines 104(*n\n*\*) and the third inhibit voltage VPL(p\p\*) applied to the other third control line or third control lines 108(*p\p*\*). The voltage at the ferroelectric portions 504 of the memory cells 2(1-N\n\*,1-M\m\*,p\*) may be about the absolute value of the difference between the third voltage VPL(p\*) applied to the associated third control line 108(*p*\*) and the third inhibit voltage VPL(p\p\*) applied to the other third control line or third control lines 108(*p\p*\*). The voltage at the ferroelectric portions 504 of the memory cells 2(1-N\n\*,1-M\m\*,1-P\p\*) may have a voltage value of about 0V.

According to an example, each access device 110(*n,m*) of the plurality of access devices 110(1-N,1-M) may include a respective field-effect transistor (e.g., an NFET) and the read control circuit may be configured to read out the memory cell to be read out 2(n\*,m\*,p\*) by supplying (e.g., applying) a first voltage VBL(n\*) having a voltage value of 0V to the associated first control line 104(*n*\*), a second voltage VWL (m\*) having a voltage value of 2.5V to the associated second control line 106(*m*\*), and a third voltage VPL(p\*) having a voltage value of 2V to the associated third control line 108(*p*\*). The write control circuit may be further configured (e.g., during writing the memory cell to be written 2(n\*,m\*, p\*)) to supply (e.g., apply) a first inhibit voltage VBL(n\n\*) having a voltage value of 0V to the corresponding first control line or first control lines 104(*n\n*\*), a second inhibit voltage VWL(m\m\*) having a voltage value of 0V to the corresponding second control line or second control lines 106(*m\m*\*), and/or a third inhibit voltage VPL(p\P\*) having a voltage value of 1V to the corresponding third control line or third control lines 108(*p\p*\*). Each memory cell 2(n,m,p) of the plurality of memory cells 2(1-N,1-M,1-P) may include a respective ferroelectric portion 504 and the voltage at the ferroelectric portion 504 of the memory cell to be read out 2(n\*,m\*,p\*) may have a voltage value of −2V, the voltage at the ferroelectric portions 504 of the memory cells 2(n\*,m\*,1-P\p\*) may have a voltage value of −1V, the voltage at the ferroelectric portions 504 of the memory cells 2(n\*,1-M\m\*,p\*) may have a voltage value of about −1V, the voltage at the ferroelectric portions 504 of the memory cells 2(n\*,1-M\m\*,1-P\p\*) may have a voltage value of about 0V, the voltage at the ferroelectric portions 504 of the memory cells 2(1-N\n\*,m\*,p\*) may have a voltage value of about 0V, the voltage at the ferroelectric portions 504 of the memory cells 2(1-N\n\*,m\*,1-P\p\*) may have a voltage value of about −1V, the voltage at the ferroelectric portions 504 of the memory cells 2(1-N\n\*,1-M\m\*,p\*) may have a voltage value of about −1V, and/or the voltage at the ferroelectric portions 504 of the memory cells 2(1-N\n\*,1-M\m\*,1-P\p\*) may have a voltage value of about 0V.

According to an example, each access device 110(*n,m*) of the plurality of access devices 110(1-N,1-M) may include a respective transmission gate and the write control circuit may be configured to erase the memory cell to be written 2(n\*,m\*,p\*) by supplying (e.g., applying) a first voltage VBL(n\*) having a voltage value of −1V to the associated first control line 104(*n*\*), a second voltage VWL(m\*) having a voltage value of 1.5V to the associated second control line 106(*m*\*), and a third voltage VPL(p\*) having a voltage value of 1V to the associated third control line 108(*p*\*). The write control circuit may be further configured (e.g., during erasing the memory cell to be written 2(n\*,m\*,p\*)) to supply (e.g., apply) a first inhibit voltage VBL(n\n\*) having a voltage value of 0V to the corresponding first control line or first control lines 104(*n\n*\*), a second inhibit voltage VWL (m\m\*) having a voltage value of 0V to the corresponding second control line or second control lines 106(*m\m*\*), and/or a third inhibit voltage VPL(p\p\*) having a voltage value of 0V to the corresponding third control line or third control lines 108(*p\p*\*). Each memory cell 2(n,m,p) of the plurality of memory cells 2(1-N,1-M,1-P) may include a respective ferroelectric portion 504 and the voltage at the ferroelectric portion 504 of the memory cell to be erased 2(n\*,m\*,p\*) may have a voltage value of −2V, the voltage at the ferroelectric portions 504 of the memory cells 2(n\*,m\*, 1-P\p\*) may have a voltage value of −1V, the voltage at the ferroelectric portions 504 of the memory cells 2(n\*,1-M\m\*, p\*) may have a voltage value of about −1V, the voltage at the ferroelectric portions 504 of the memory cells 2(n\*,1-M\m\*, 1-P\p\*) may have a voltage value of about 0V, the voltage at the ferroelectric portions 504 of the memory cells 2(1-N\n\*,m\*,p\*) may have a voltage value of about −1V, the voltage at the ferroelectric portions 504 of the memory cells 2(1-N\n\*,m\*,1-P\p\*) may have a voltage value of about 0V, the voltage at the ferroelectric portions 504 of the memory cells 2(1-N\n\*,1-M\m\*,p\*) may have a voltage value of about −1V, and/or the voltage at the ferroelectric portions 504 of the memory cells 2(1-N\n\*,1-M\m\*,1-P\p\*) may have a voltage value of about 0V.

Figure 7:
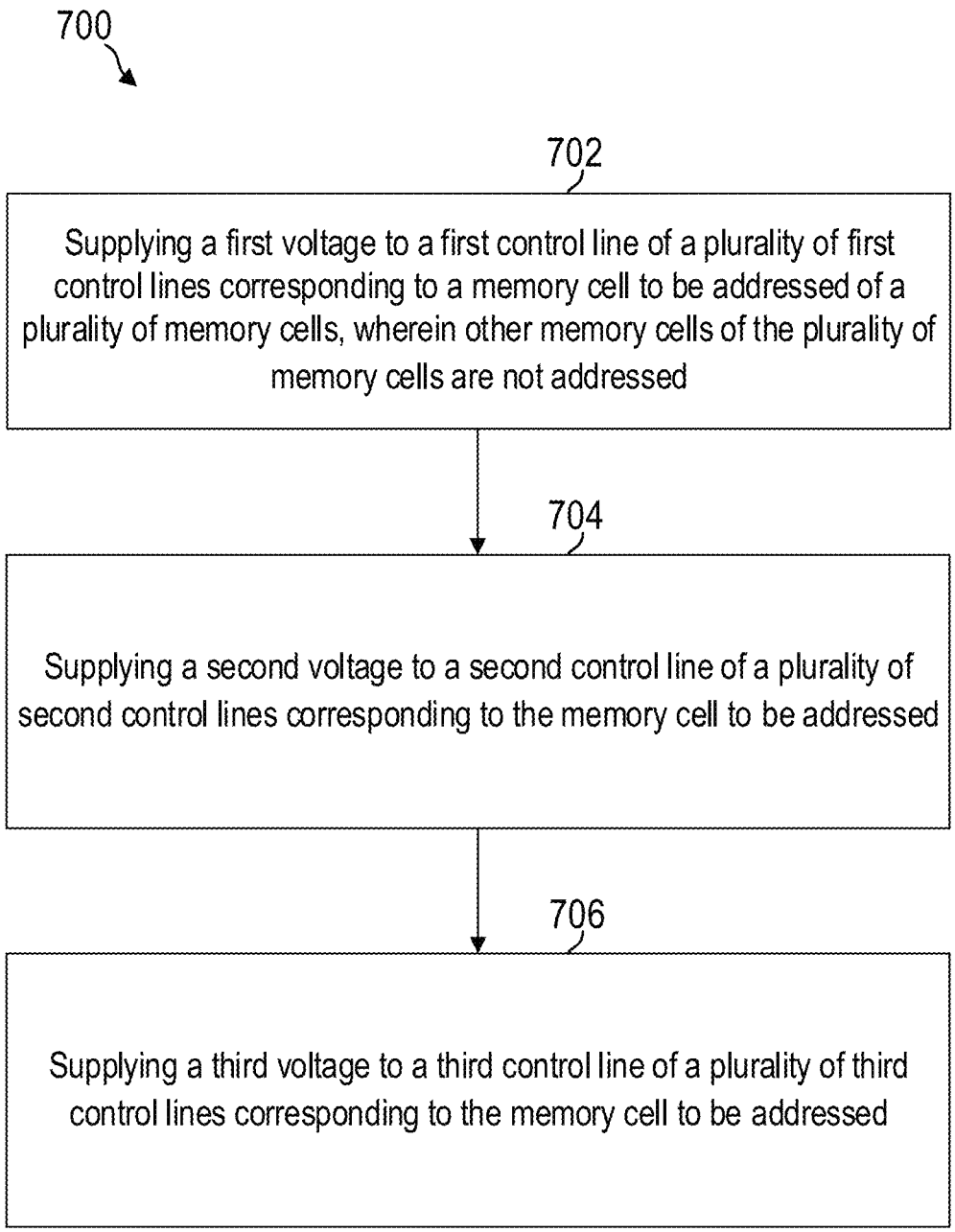
FIG. 7 shows a schematic flow diagram of a method for operating a memory cell arrangement, according to various aspects.

FIG. 7 shows a schematic flow diagram of a method 700, e.g., a method for operating a memory cell arrangement 100, according to various aspects. The method 700 may include supplying (e.g., applying) a first voltage to a first control line of a plurality of first control lines corresponding to a memory cell to be addressed (e.g., to be programmed, erased, or read out) selected from a plurality of memory cells (in 702). The method 700 may include that other memory cells of the plurality of memory cells are not addressed. The method 700 may include supplying (e.g., applying) a second voltage to a second control line of a plurality of second control lines corresponding to the memory cell to be addressed (in 704). The method 700 may include supplying (e.g., applying) a third voltage to a third control line of a plurality of third control lines corresponding to the memory cell to be addressed (in 704).

According to various aspects, the method 700 may include supplying (e.g., applying) a first inhibit voltage to one or more first control lines of the plurality of first control lines not corresponding to the memory cell to be addressed.

The method 700 may further include supplying (e.g., applying) a second inhibit voltage to one or more second control lines of the plurality of second control lines not corresponding to the memory cell to be addressed. The first inhibit voltage and the second inhibit voltage may be configured (e.g., selected such that) to prohibit connection between a first control line and one or more memory cells not to be addressed via an associated access device.

The method 700 may further include supplying (e.g., applying) a third inhibit voltage to one or more third control lines of the plurality of third control lines not corresponding to the memory cell to be addressed. The third inhibit voltage may be configured (e.g., selected such that) to prohibit that one or more memory cells not to be addressed change into another one of at least two memory states of the respective memory cell.

Figure 8A:
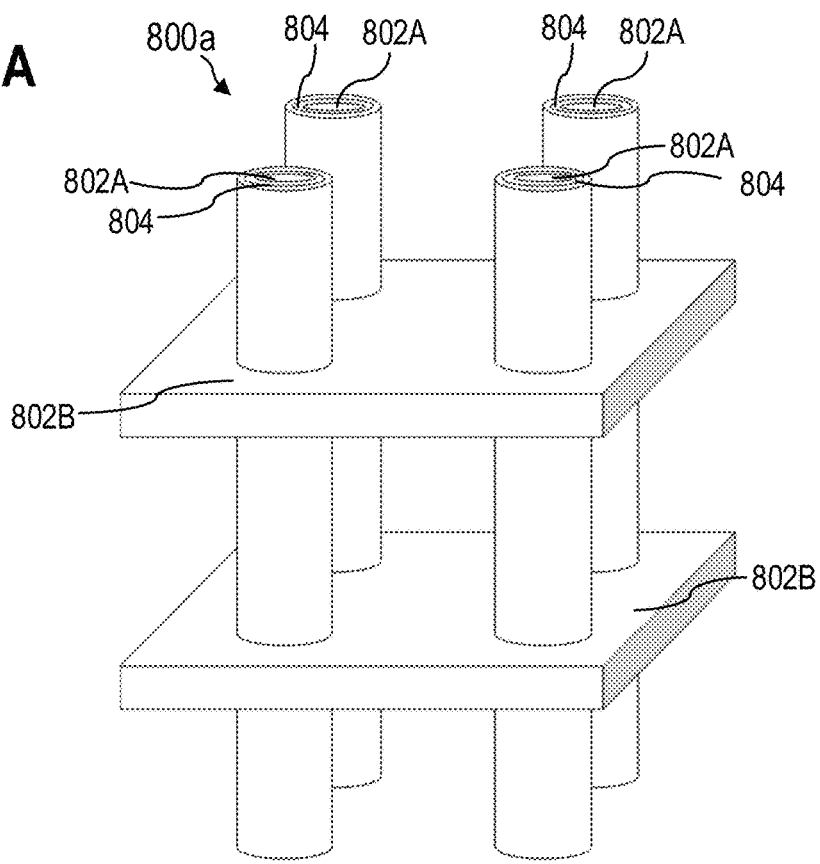
FIGS. 8A and 8B show illustrate exemplary memory cell arrangements having memory cells that share a common first electrode and a common second electrode, according to various aspects.
Figure 8B:
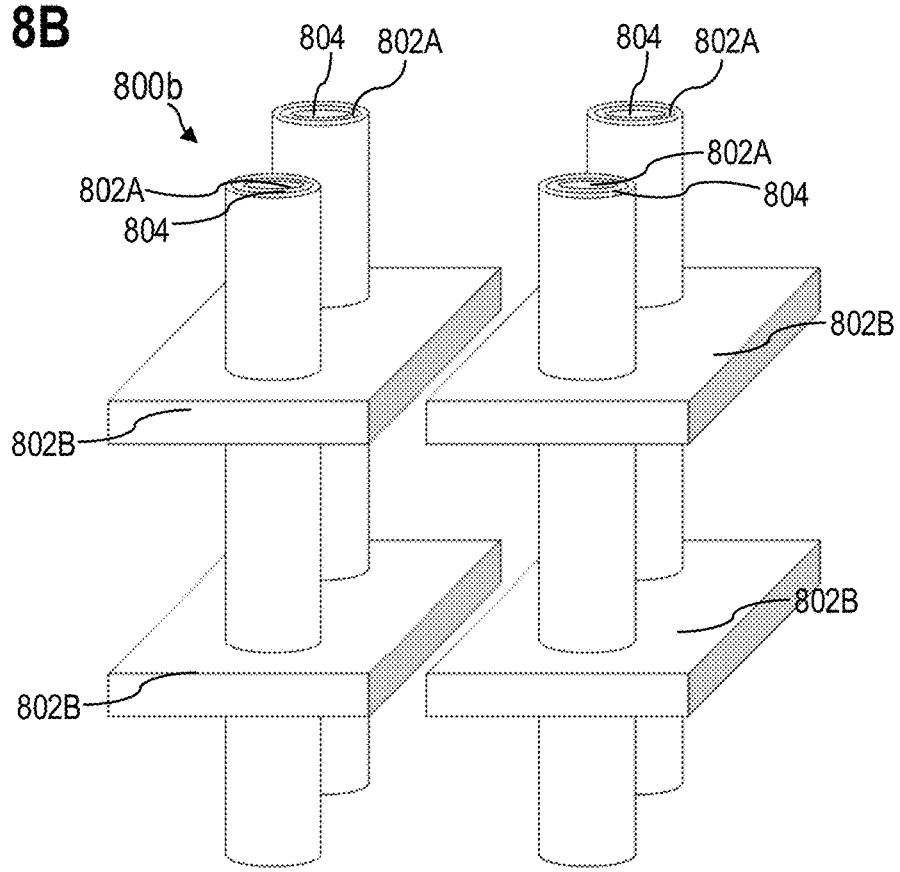

FIGS. 8A and 8B show exemplary memory cell arrangements 800a, 800b having memory cells that share a common first electrode 802A and a common second electrode 802B. For example, each memory cell 2(n,m,p) of the plurality of memory cells 2(1-N,1-M,1-P) may be associated to a common first electrode 802A and a common second electrode 802B.

As shown in FIGS. 8A and 8B, each first electrode portion 502A of the memory cells 2(n*,m*,1-P) of a respective first memory cell subset may be part of or may provide a common first electrode 802A. Each of the common first electrodes 802A may include an elongated shape (e.g., an oblong shape, a tube shape, a pillar shape, etc.).

According to various aspects, as shown in FIG. 8A, the second electrode portions 502B of all memory cells that share a third control line 108(p) of the plurality of third control lines 108(1-P) may be part of or may provide a common second electrode 802B. For example, each memory cell 2(n,m,p) of the plurality of memory cells 2(1-N,1-M, 1-P) may be associated to a common first electrode 802A and a common second electrode 802B.

According to various aspects, as shown in FIG. 8B, the second electrode portions 502B of all memory cells 2(n*, 1-M,p*) of a respective second memory cell subset may be part of or may provide a common second electrode 802B.

Each of the common second electrodes 802B may include a plate shape. According to various aspects, for one or more memory cells of the plurality of memory cells (e.g., all memory cells), a common first electrode 802A may extend through (e.g., completely extend through) a corresponding common second electrode 802B.

According to various aspects, a common ferroelectric layer (e.g., a continuous ferroelectric layer) 804 may be arranged between the common first electrode 802A and the common second electrode 802B. For example, the common ferroelectric layer 804 may have a curved shape and may fill a gap between the adjacent common first electrode 802A and common second electrode 802B.

In the following, various examples are provided that may include one or more aspects described above with reference to the memory cell arrangement 100 and the method 700. It may be intended that aspects described in relation to the memory arrangement 100 may apply also to the method 700, and vice versa.

Example 1 is a memory cell arrangement including a plurality of memory cell sets, each memory cell set of the plurality of memory cell sets including a plurality of memory cells, a plurality of first control lines; a plurality of second control lines; and a plurality of third control lines. Each memory cell set of the plurality of memory cell sets may be assigned to a corresponding first control line of the plurality of first control lines. Each memory cell set of the plurality of memory cell sets may include at least a first memory cell subset addressable via the corresponding first control line, a corresponding second control line of the plurality of second control lines, and the plurality of third control lines, and at least a second memory cell subset addressable via the corresponding first control line, the plurality of second control lines, and a corresponding third control line of the plurality of third control lines. The corresponding third control line of the plurality of third control lines may address the second memory cell subset of each memory cell set of the plurality of memory cell sets.

In Example 2, the memory cell arrangement of Example 1 may optionally further include, for each memory cell set of the plurality of memory cell sets, a plurality of first memory cell subsets including the first memory cell subset and one or more additional first memory cell subsets, the one or more additional first memory cell subsets addressable via the corresponding first control line, one or more other corresponding second control lines of the plurality of second control lines, and the plurality of third control lines In Example 3, the memory cell arrangement of Example 1 or 2 may optionally further include, for each memory cell set of the plurality of memory cell sets, a plurality of second memory cell subsets including the second memory cell subset and one or more additional second memory cell subsets, the one or more additional second memory cell subsets addressable via the corresponding first control line, the plurality of second control lines, and one or more other corresponding third control lines of the plurality of third control lines.

In Example 4, the memory cell arrangement of any one of Examples 1 to 3, further including a plurality of access devices, for each memory cell set of the plurality of memory cell sets, each first memory cell subset (the first memory cell subset or each of the plurality of first memory cell subsets) is assigned to a corresponding access device of the plurality of access devices; that each first memory cell subset (the first memory cell subset or each of the plurality of first memory cell subsets) is addressable via the corresponding access device. The corresponding access device connects the respective first memory cell subset to the corresponding first control line controlled by the corresponding second control line.

Example 5 is a memory cell arrangement including: a plurality of memory cell sets, each memory cell set including a plurality of memory cells, each memory cell of the plurality of memory cells of the respective memory cell set is unambiguously assigned to one of a plurality of first memory cell subsets and one of a plurality of second memory cell subset, a plurality of access device sets, each access device set including two or more access devices. each (access device set) of the plurality of access device sets is unambiguously assigned to one corresponding memory cell set of the plurality of memory cell sets, wherein, for each access device set of the plurality of access device sets, each access device) of the two or more access devices is unambiguously assigned to one of the plurality of first memory cell subsets of the corresponding memory cell set; a plurality of first control lines, wherein each first control line of the plurality of first control lines is unambiguously assigned to one access device set of the plurality of access device sets; a plurality of second control lines, wherein each second control line of the plurality of second control lines is assigned to a corresponding access device of each of the plurality of access device sets; a plurality of third control lines, wherein each third control line of the plurality of third control lines is assigned to a corresponding second memory cell subset of the plurality of second memory cell subsets of each of the plurality of memory cell sets.

In Example 6, the memory cell arrangement of Example 4 or 5 may optionally further include that one or more of the access devices (the plurality of access devices or the two or more access devices of one or more access device sets of the plurality of access device sets) may include a respective transmission gate.

In Example 7, the memory cell arrangement of any one of Examples 4 to 6 may optionally further include that one or more of the access devices (the plurality of access devices or the two or more access devices of one or more access device sets of the plurality of access device sets) may include a respective transistor, preferably a field-effect transistor.

In Example 8, the memory cell arrangement of Example 1 to 7 may optionally further include that each memory cell (each memory cell of the plurality of memory cells of each memory cell set of the plurality of memory cell sets), is a volatile memory cell or a non-volatile memory cell.

In Example 9, the memory cell arrangement of Example 1 to 8 may optionally further include that each memory cell includes a ferroelectric memory cell.

In Example 10, the memory cell arrangement of Example 9 may optionally further include that the memory cell arrangement includes a non-volatile ferroelectric memory cell arrangement (e.g., a ferroelectric random access memory (FeRAM)).

In Example 11, the memory cell arrangement of Example 9 or 10 may optionally further include that each ferroelectric memory cell of the ferroelectric memory cells includes a ferroelectric capacitor.

In Example 12, the memory cell arrangement of Example 11 may optionally further include that at least one ferroelectric capacitor includes a ferroelectric material, preferably ferroelectric hafnium oxide.

In Example 13, the memory cell arrangement of any one of Examples 1 to 12 may optionally further include that each first control line of the plurality of first control lines is a bitline, that each second control line of the plurality of second control lines is a wordline, and/or that each third control line of the plurality of third control lines is a plateline.

In Example 14, the memory cell arrangement of Example 4 or 5 and optionally further of any one of Examples 6 to 14 may optionally further include a plurality of fourth control lines, each fourth control line of the plurality of fourth control lines connects a respective first memory cell subset of the plurality of first memory cell subsets with the corresponding access device.

In Example 15, the memory cell arrangement of Example 14 may optionally further include that each fourth control line of the plurality of fourth control lines is a sourceline.

In Example 16, the memory cell arrangement of Example 14 or 15 may optionally further include that each access device of the plurality of access devices may include a first control node (e.g., a source node), a second control node (e.g., a gate node), and a third node (e.g., a drain node). The first control node of each access device) may be connected to the corresponding first control line of the plurality of first control lines. The second control node of each access device may be connected to the corresponding second control line of the plurality of second control lines. The third control node of each access device may be connected to the corresponding fourth control line of the plurality of fourth control lines.

In Example 17, the memory cell arrangement of Example 16 may optionally further include that, for each access device, an electrical behavior of the first control node and the third control node is controlled via the second control node.

In Example 18, the memory cell arrangement of Example 17 may optionally further include that the electrical behavior includes an electrical resistance associated with an electrical current flow between the first control node and the third control node.

In Example 19, the memory cell arrangement of any one of Examples 1 to 18 may optionally further include that the plurality of first control lines may include a first number, N, of first control lines, the first number, N, is an integer number greater than one.

In Example 20, the memory cell arrangement of Example 19 may optionally further include that the plurality of memory cell sets may include a number of memory cell sets equal to the first number, N.

In Example 21, the memory cell arrangement of any one of Examples 1 to 20 may optionally further include that the plurality of second control lines may include a second number, M, of second control lines, the second number, M, is an integer number greater than one.

In Example 22, the memory cell arrangement of Examples 2 and 21 may optionally further include that, for each memory cell set of the plurality of memory cell sets, the plurality of first memory cell subsets may include a number of first memory cell subsets equal to the second number, M.

In Example 23, the memory cell arrangement of Examples 3 and 22 may optionally further include that each second memory cell subset of the plurality of second memory cell subsets may include a number of memory cells equal to the second number, M.

In Example 24, the memory cell arrangement of any one of Examples 19 to 23 may optionally further include that, for each first memory cell subset of the plurality of first memory cell subsets, all memory cells of a respective first memory cell subsets are arranged in a corresponding space region. The space regions of all of the plurality of first memory cell subsets are arranged in an array configuration, wherein the array $A(n=1-N,m=1-M)$ may include N times M space regions.

In Example 25, the memory cell arrangement of any one of Examples 1 to 26 may optionally further include that the plurality of third control lines may include a third number, P, of third control lines, the third number, P, is an integer number greater than one.

In Example 26, the memory cell arrangement of Examples 2 and 27 may optionally further include that each first memory cell subset of the plurality of first memory cell subsets may include a number of memory cells equal to the third number, P.

In Example 27, the memory cell arrangement of Examples 24 and 26 may optionally further include that all memory cells are arranged in a three-dimensional array configuration. The array $A(n=1-N,m=1-M,p=1-P)$ may include N times M times P memory cells.

In Example 28, the memory cell arrangement of Example 4 or 5 and any one of Examples 24 to 27 may optionally further include that the plurality of access devices may include a fourth number, $N \times M$, of access devices, the fourth number, $N \times M$, is equal to the product (multiplication product) of the first number, N, and the second number, M.

In Example 29, the memory cell arrangement of Examples 14 and 28 may optionally further include that the plurality of fourth control lines may include a number of fourth control lines equal to the fourth number, N×M.

In Example 30, the memory cell arrangement of any one of Examples 1 to 29 may optionally further include that each memory cell (each memory cell of the plurality of memory cells) may include a first electrode portion and a second electrode portion.

In Example 31, the memory cell arrangement of Example 4 or 5 and Example 30 may optionally further include that each first electrode portion of a respective memory cell is (e.g., electrically conductively) connected to the corresponding access device.

In Example 32, the memory cell arrangement of Examples 14 and 31 may optionally further include that, for each first memory cell subset, each first electrode portion of the memory cells of a respective first memory cell subset is connected to the corresponding access device via the corresponding fourth control line.

In Example 33, the memory cell arrangement of any one of Examples 30 to 32 may optionally further include that each second electrode portion of a respective memory cell is (e.g., electrically conductively) connected to the corresponding third control line.

In Example 34, the memory cell arrangement of any one of Examples 30 to 33 may optionally further include that the second electrode portions of respective one or more memory cells at least partially surround the corresponding first electrode portion.

In Example 35, the memory cell arrangement of any one of Examples 30 to 34 may optionally further include that the first electrode portions of all memory cells of each first memory cell subset are part of or provide a common first electrode.

In Example 36, the memory cell arrangement of Examples 14 and 35 may optionally further include that the common first electrode portion is configured as the corresponding fourth control line, and/or the common first electrode connects each memory cell of the respective first memory cell subset to the corresponding access device.

In Example 37, the memory cell arrangement of Example 35 or 36 may optionally further include that the common first electrode may include an elongated shape with a base geometry of one of the following: a circle, a triangle, a square, a parallelogram, a trapezoid, an ellipse, a polygon, etc.

In Example 38, the memory cell arrangement of any one of Examples 30 to 36 may optionally further include that the second electrode portions of all memory cells of each second memory cell subset are part of or provide a common second electrode.

In Example 39, the memory cell arrangement of any one of Examples 30 to 37 may optionally further include that the second electrode portions of all memory cells that share one of the plurality of third control lines are part of or provide a common second electrode. Further optionally the common second electrode may be (electrically conductive) connected to the corresponding third control line.

In Example 40, the memory cell arrangement of Example 38 or 39 may optionally further include that the common second electrode may include a plate shape.

In Example 41, the memory cell arrangement of Example 39 or 40 may optionally further include that the common second electrode completely surrounds the first electrode portions of the corresponding memory cells.

In Example 42, the memory cell arrangement of any one of Examples 30 to 41 may optionally further include that a ferroelectric portion is arranged between the first electrode portion and the second electrode portion of each of the memory cells.

In Example 43, the memory cell arrangement of Examples 35 and 42 may optionally further include that the memory cells associated to a common first electrode may include a common ferroelectric layer.

In Example 44, the memory cell arrangement of Example 42 or 43 may optionally further include that all memory cells that share one of the plurality of fourth control lines may include a common ferroelectric layer (e.g., a continuous ferroelectric layer).

In Example 45, the memory cell arrangement of any one of Examples 42 to 44 may optionally further include that the ferroelectric portions (the ferroelectric portion or the common ferroelectric layer) of each memory cell at least partially surround the corresponding first electrode portion, preferably completely perimeterally surrounding the corresponding first electrode portion.

In Example 46, the memory cell arrangement of any one of Examples 42 to 45 may optionally further include that the ferroelectric portion includes ferroelectric hafnium oxide.

In Example 47, the memory cell arrangement of any one of Examples 42 to 46 may optionally further include that the ferroelectric portion is or includes a remanent-polarizable layer, optionally the remanent-polarizable layer includes a first polarization state with a first residual polarization and a second polarization state with a second residual polarization.

In Example 48, the memory cell arrangement of Example 47 may optionally further include that an absolute value of a first residual polarization of the remanent-polarizable layer associated with the first polarization state is substantially equal to an absolute value of a second residual polarization of the remanent-polarizable layer associated with the second polarization state.

In Example 49, the memory cell arrangement of any one of Examples 1 to 48 may optionally further include a write control circuit, configured to write (e.g., to program and/or erase) one of the memory cells.

In Example 50, the memory cell arrangement of Example 49 may optionally further include that writing the memory cell may include bringing the memory cell from one of at least two memory states into another one of the at least two memory states of the memory cell.

In Example 51, the memory cell arrangement of Example 49 or 50 may optionally further include that the write control circuit is configured to apply one or more first voltages to the plurality of first control lines, one or more second voltages to the plurality of second control lines, and one or more third voltages to the plurality of third control lines such that the memory cell to be written is written and other one or more memory cells are not written.

In Example 52, the memory cell arrangement of Example 51 may optionally further include that the memory cell to be written has a first control line of the plurality of first control lines, a second control line of the plurality of second control lines, and a third control line of the plurality of third control lines associated therewith. The write control circuit may be configured to write the memory cell to be written by supplying (applying) a first voltage to the associated first control line, a second voltage to the associated second control line, and a third voltage to the associated third control line.

In Example 53, the memory cell arrangement of Example 52 may optionally further include that the write control circuit is further configured to supply (apply) another first voltage (e.g., a first inhibit voltage) to one or more other first control lines, another second voltage (e.g., a second inhibit voltage) to one or more other second control lines), and another third voltage (e.g., a third inhibit voltage) to one or more other third control lines.

In Example 54, the memory cell arrangement of Example 53 may optionally further include that each access device of the plurality of access devices is associated to a corresponding first control line of the plurality of first control lines and a corresponding second control line of the plurality of second control lines, and wherein the write control circuit is configured to supply (apply), for each access device of the plurality of access devices, the first inhibit voltage to the corresponding first control line and the second inhibit voltage to the corresponding second control line such that a connection between the corresponding first control line and the first memory cell subset corresponding to the access device is prohibited.

In Example 55, the memory cell arrangement of Example 53 or 54 may optionally further include that the write control circuit is configured to supply the third inhibit voltage supplied to the one or more other third control lines such that the memory cells sharing a respective third control line of the one or more other third control lines do not change into another one of the at least two memory states of the respective memory cell.

In Example 56, the memory cell arrangement of any one of Examples 52 to 55 may optionally further include that the memory cell to be written further has a fourth control line of the plurality of fourth control lines associated therewith, and the write control circuit is further configured to supply (apply) one or more fourth voltages (e.g., a fourth voltage, e.g., a fourth inhibit voltage) to one or more fourth control lines not associated with the memory cell to be written, In Example 57, the memory cell arrangement of Example 42 and any one of Examples 53 to 56 may optionally further include that the absolute value of the difference between the first voltage applied to the associated first control line and the third voltage applied to the associated third control line is larger than the absolute value of a coercive voltage of the ferroelectric portion.

In Example 58, the memory cell arrangement of any one of Examples 1 to 57 may optionally further include a read control circuit, configured to read out one of the memory cells.

In Example 59, the memory cell arrangement of Example 58 may optionally further include that reading the memory cell includes erasing the memory cell.

In Example 60, the memory cell arrangement of Example 58 or 59 may optionally further include that the read control circuit is configured to apply one or more first voltages to the plurality of first control lines, one or more second voltages to the plurality of second control lines, and one or more third voltages to the plurality of third control lines, and the read control circuit is optionally further configured to detect a potential difference between the corresponding first control line and a reference voltage such that the memory cell to be read out is read out and other one or more memory cells are not read out.

In Example 61, the memory cell arrangement of Example 60 may optionally further include that the memory cell to be read out has a first control line of the plurality of first control lines, a second control line of the plurality of second control lines, and a third control line of the plurality of third control lines associated therewith. The read control circuit may be configured to read out the memory cell to be read out by supplying (applying) a first voltage to the associated first control line, a second voltage to the associated second control line, and a third voltage to the associated third control line, and by detecting the potential difference between the corresponding first control line and the reference voltage.

In Example 62, the memory cell arrangement of Example 61 may optionally further include that the read control circuit is further configured to supply (apply) another first voltage (e.g., a first inhibit voltage) to one or more other first control lines, another second voltage (e.g., a second inhibit voltage) to one or more other second control lines), and another third voltage (e.g., a third inhibit voltage) to one or more other third control lines.

In Example 63, the memory cell arrangement of Example 62 may optionally further include that each access device of the plurality of access devices is associated to a corresponding first control line of the plurality of first control lines and a corresponding second control line of the plurality of second control lines, and wherein the read control circuit is configured to supply (apply), for each access device of the plurality of access devices, the first inhibit voltage to the corresponding first control line and the second inhibit voltage to the corresponding second control line such that a connection between the corresponding first control line and the first memory cell subset corresponding to the access device is prohibited.

In Example 64, the memory cell arrangement of Example 62 or 63 may optionally further include that the read control circuit is configured to supply the third inhibit voltage supplied to the one or more other third control lines such that the memory cells sharing a respective third control line of the one or more third control lines do not change into another one of the at least two memory states of the respective memory cell.

In Example 65, the memory cell arrangement of any one of Examples 61 to 64 may optionally further include that the memory cell to be read out further has a fourth control line of the plurality of fourth control lines associated therewith, and the read control circuit is further configured to supply (apply) one or more fourth voltages (e.g., a fourth voltage, e.g., a fourth inhibit voltage) to one or more fourth control lines not associated with the memory cell to be read out.

In Example 66, the memory cell arrangement of Example 42 and any one of Examples 62 to 65 may optionally further include that the absolute value of the difference between the first voltage applied to the associated first control line and the third voltage applied to the associated third control line is larger than the absolute value of a coercive voltage of the ferroelectric portion.

Example 67 is a memory cell arrangement including a first memory cell set including a first memory cell, a second memory cell, a third memory cell, and a fourth memory cell, a second memory cell set including a first memory cell, a second memory cell, a third memory cell, and a fourth memory cell; a first control line set including first control line assigned to each memory cell of the first memory cell set and a second control line assigned to the second memory cell set; a second control line set including a first control line and a second control line. The first control line is assigned to the first memory cell and the second memory cell of the first memory cell set and to the first memory cell and the second memory cell of the second memory cell set, and the second control line is assigned to the third memory cell and the fourth memory cell of the first memory cell set and to the third memory cell and the fourth memory cell of the second memory cell set; a third control line set including a first control line and a second control line, wherein the first control line is assigned to the first memory cell and the third memory cell of the first memory cell set and to the first memory cell and the third memory cell of the second memory cell set, and wherein the second control line is assigned to the second memory cell and the fourth memory cell of the first memory cell set and to the second memory cell and the fourth memory cell of the second memory cell set In Example 68, the memory cell arrangement of Example 67 may optionally further include a first access device set including a first access device and a second access device. The first control line of the second control line set may be configured to control the first access device to connect the first control line of the first control line set to the memory cells of the first memory cell set corresponding to the first control line of the second control line set, and the second control line of the second control line set may be configured to control the second access device to connect the first control line of the first control line set to the memory cells of the first memory cell set corresponding to the second control line of the second control line set. The memory cell arrangement may further include a second access device set including a first access device and a second access device, wherein the first control line of the second control line set is configured to control the first access device to connect the second control line of the first control line set to the memory cells of the second memory cell set corresponding to the first control line of the second control line set, and wherein the second control line of the second control line set is configured to control the second access device to connect the second control line of the first control lines set (104) to the memory cells of the second memory cell set corresponding to the second control line of the second control line set.

In Example 69, the memory cell arrangement of Example 67 or 68 may optionally further include a third memory cell set including a first memory cell, a second memory cell, a third memory cell, and a fourth memory cell. The first control line set may further include a third control line assigned to each memory cell of the third memory cell set. The first control line of the second control line set may be further assigned to the first memory cell and the second memory cell of the third memory cell set, and the second control line of the second control line set may be further assigned to the third memory cell and the fourth memory cell of the third memory cell set. The first control line of the third control line set may be further assigned to the first memory cell and the third memory cell of the third memory cell set, and the second control line of the third control line set may be assigned to the second memory cell and the fourth memory cell of the third memory cell set.

In Example 70, the memory cell arrangement of Example 69 may optionally further include a third access device set including a first access device and a second access device. The first control line of the second control line set is configured to control the first access device to connect the third control line of the first control line set to the memory cells of the third memory cell set corresponding to the first control line of the second control line set, and the second control line of the second control line set is configured to control the second access device to connect the third control line of the first control line set to the memory cells of the third memory cell set corresponding to the second control line of the second control line set.

In Example 71, the memory cell arrangement of Example 69 or 70 may optionally further include that the first memory cell set further includes a fifth memory cell and a sixth memory cell, the second memory cell set further includes a fifth memory cell and a sixth memory cell; and that the second control line set further includes a third control line, wherein the third control line is assigned to the fifth memory cell and the sixth memory cell of the first memory cell set and to the fifth memory cell and the sixth memory cell of the second memory cell set; that the first control line of the third control line set is further assigned to the fifth memory cell of the first memory cell set and to the fifth memory cell of the second memory cell set, and that the second control line of the third control line set is further is assigned to the sixth memory cell of the first memory cell set and the sixth memory cell of the second memory cell set.

In Example 72, the memory cell arrangement of Examples 68 and 71 may optionally further include that the first access device set further includes a third access device, the second access device set further includes a third access device; that the third control line of the second control line set is configured to control the third access device of the first access device set to connect the first control line of the first control line set to the memory cells of the first memory cell set corresponding to the third control line of the second control line set, and that the third control line of the second control line set is configured to control the third access device of the second access device set to connect the second control line of the first control line set to the memory cells of the second memory cell set corresponding to the third control line of the second control line set.

In Example 73, the memory cell arrangement of any one of Examples 69 to 72 may optionally further include that the third memory cell set further includes a fifth memory cell and a sixth memory cell, the third control line of the second control line set is further assigned to the fifth memory cell and the sixth memory cell of the third memory cell set; that the first control line of the third control line set is further assigned to the fifth memory cell of the third memory cell set, and that the second control line of the third control line set is further is assigned to the sixth memory cell of the third memory cell set.

In Example 74, the memory cell arrangement of Examples 70 and 73 may optionally further include that the third access device set further includes a third access device, the third control line of the second control line set is configured to control the third access device of the third access device set to connect the third control line of the first control line set to the memory cells of the third memory cell set corresponding to the third control line of the second control line set.

In Example 75, the memory cell arrangement of any one of Examples 69 to 74 may optionally further include that the first memory cell set further includes a seventh memory cell and an eighth memory cell, the second memory cell set further includes a seventh memory cell and an eighth memory cell; that the first control line of the second control line set is further assigned to the seventh memory cell of the first memory cell set and the seventh memory cell of the second memory cell set, and that the second control line of the second control line set is further assigned to the eighth memory cell of the first memory cell set and the eighth memory cell of the second memory cell set; that the third control line set further includes a third control line, wherein the third control line is assigned to the seventh memory cell and the eighth memory cell of the first memory cell set and to the seventh memory cell and the eighth memory cell of the second memory cell set.

In Example 76, the memory cell arrangement of Examples 69 to 75 may optionally further include that the third memory cell set further includes a seventh memory cell and an eighth memory cell, the first control line of the second control line set is further assigned to the seventh memory cell of the third memory cell set, and wherein the second control line of the second control line set is further assigned to the eighth memory cell of the third memory cell set; wherein the third control line of the third control line set is further assigned to the seventh memory cell and the eighth memory cell of the third memory cell set.

In Example 77, the memory cell arrangement of any one of Examples 69 to 76 may optionally further include that the first memory cell set further includes a ninth memory cell, the second memory cell set further includes a ninth memory cell; wherein the third control line of the second control line set is further assigned to the ninth memory cell of the first memory cell set and the ninth memory cell of the second memory cell set; wherein the third control line of the third control line set is further assigned to the ninth memory cell of the first memory cell set and the ninth memory cell of the second memory cell set.

In Example 78, the memory cell arrangement of any one of Examples 69 to 77 may optionally further include that the third memory cell set further includes a ninth memory cell, the third control line of the second control line set is further assigned to the ninth memory cell of the third memory cell set; wherein the third control line of the third control line set is further assigned to the ninth memory cell of the third memory cell set.

Example 79 is a memory cell arrangement including a first memory cell set including a first memory cell, a second memory cell, a third memory cell, and a fourth memory cell, a second memory cell set including a first memory cell, a second memory cell, a third memory cell, and a fourth memory cell; a first bitline assigned to each memory cell of the first memory cell set; a second bitline assigned to the second memory cell set; a first wordline assigned to the first memory cell and the second memory cell of the first memory cell set and to the first memory cell and the second memory cell of the second memory cell set; a second wordline assigned to the third memory cell and the fourth memory cell of the first memory cell set and to the third memory cell and the fourth memory cell of the second memory cell set; a first plateline assigned to the first memory cell and the third memory cell of the first memory cell set and to the first memory cell and the third memory cell of the second memory cell set; a second plateline assigned to the second memory cell and the fourth memory cell of the first memory cell set and to the second memory cell and the fourth memory cell of the second memory cell set.

In Example 80, the memory cell arrangement of Example 79 may optionally further include a first access device set including a first access device and a second access device. The first wordline may be configured to control the first access device to connect the first bitline to the memory cells of the first memory cell set corresponding to the first wordline, and the second wordline is configured to control the second access device to connect the first bitline to the memory cells of the first memory cell set corresponding to the second wordline. The memory cell arrangement may optionally further include a second access device set including a first access device and a second access device, wherein the first wordline may be configured to control the first access device to connect the second bitline to the memory cells of the second memory cell set corresponding to the first wordline, and wherein the second wordline is configured to control the second access device to connect the second bitline to the memory cells of the second memory cell set corresponding to the second wordline. a first access device set including a first access device and a second access device, wherein the first access device is configured to connect the first bitline to the first memory cell and the second memory cell of the first memory cell set controlled by a voltage applied at the first wordline, and wherein the second access device is configured to connect the first bitline to the third memory cell and the fourth memory cell of the first memory cell set controlled by a voltage applied at the second wordline; and/or a second access device set including a first access device and a second access device, wherein the first access device is configured to connect the second bitline to the first memory cell and the second memory cell of the second memory cell set controlled by a voltage applied at the first wordline, and wherein the second access device is configured to connect the second bitline to the third memory cell and the fourth memory cell of the second memory cell set controlled by a voltage applied at the second wordline.

In Example 81, the memory cell arrangement of any one of Examples 67 to 80 may optionally further include that the first memory cell of the second memory cell set is a fifth memory cell, the second memory cell of the second memory cell set is a sixth memory cell, wherein the third memory cell of the second memory cell set is a seventh memory cell, and wherein the fourth memory cell of the second memory cell set is an eighth memory cell, wherein the first control line of the first control line set is a first bitline, wherein the second control line of the first control line set is a second bitline; wherein the first control line of the second control line set is a first wordline, wherein the second control line of the second control line set is a second wordline; and wherein the first control line of the third control line set is a first plateline, wherein the second control line of the third control line set is a second plateline.

In Example 82, the memory cell arrangement of Example 68 or 80 and Example 81 may optionally further include that the first access device of the second access device set is a third access device, and the second access device of the second access device set is a fourth access device.

Example 83 is a memory cell arrangement including a first memory cell, a second memory cell, a third memory cell, a fourth memory cell, a fifth memory cell, a sixth memory cell, a seventh memory cell, and an eighth memory cell, a first bitline assigned to the first memory cell, the second memory cell, the third memory cell, and the fourth memory cell; a second bitline assigned to the fifth memory cell, the sixth memory cell, the seventh memory cell, and the eighth memory cell; a first wordline assigned to the first memory cell, the second memory cell, the fifth memory cell and the sixth memory cell; a second wordline assigned to the third memory cell, the fourth memory cell, the seventh memory cell and the eighth memory cell; a first plateline assigned to the first memory cell, the third memory cell, the fifth memory cell and the seventh memory cell; a second plateline assigned to the second memory cell, the fourth memory cell, the sixth memory cell and the eighth memory cell.

In Example 84, the memory cell arrangement of Example 83 may optionally further include a first access device, a second access device, a third access device, and a fourth access device. The first wordline may be configured to control the first access device to connect the first bitline to the first memory cell and the second memory cell. The second wordline may be configured to control the second access device to connect the first bitline to the third memory cell and the fourth memory cell. The first wordline may be configured to control the third access device to connect the second bitline to the fifth memory cell and the sixth memory cell. The second wordline may be configured to control the fourth access device to connect the second bitline to the seventh memory cell and the eighth memory cell.

In Example 85, the memory cell arrangement of Example 82 or 84 may optionally further include that one or more access devices (one or more access devices of the first access device, the second access device, the third access device, and/or the fourth access device may include a respective transmission gate.

In Example 86, the memory cell arrangement of any one of Examples 82 to 85 may optionally further include that one or more access devices may include a respective transistor, preferably a field-effect transistor.

In Example 87, the memory cell arrangement of Example 82 to 86 may optionally further include that each memory cell (the first memory cell, the second memory cell, the third memory cell, the fourth memory cell, the fifth memory cell, the sixth memory cell, the seventh memory cell, and the eighth memory cell), is a volatile memory cell or a non-volatile memory cell.

In Example 88, the memory cell arrangement of Example 82 to 87 may optionally further include that each memory cell includes a ferroelectric memory cell.

In Example 89, the memory cell arrangement of Example 88 may optionally further include that. the memory cell arrangement includes a non-volatile ferroelectric memory cell arrangement (e.g., a ferroelectric random access memory (FeRAM)).

In Example 90, the memory cell arrangement of Example 88 or 89 may optionally further include that each ferroelectric memory cell of the ferroelectric memory cells includes a ferroelectric capacitor.

In Example 91, the memory cell arrangement of Example 90 may optionally further include that at least one ferroelectric capacitor includes a ferroelectric material, preferably ferroelectric hafnium oxide.

In Example 92, the memory cell arrangement of Example 82 or 84 and optionally further of any one of Examples 85 to 91 may optionally further include a first sourceline connecting the first memory cell and the second memory cell with the first access device, a second sourceline connecting the third memory cell and the fourth memory cell with the second access device; a third sourceline connecting the fifth memory cell and the sixth memory cell with the third access device; and a fourth sourceline connecting the seventh memory cell and the eighth memory cell with the fourth access device.

In Example 93, the memory cell arrangement of Example 92 may optionally further include that each access device may include a first control node (e.g., a source node), a second control node (e.g., a gate node), and a third node (e.g., a drain node). The first control node of each access device is connected to the corresponding bitline of the first bitline or second bitline, wherein the second control node of each access device is connected to the corresponding wordline of the first wordline or second wordline, and wherein the third control node of each access device is connected to the corresponding sourceline of the first sourceline, second sourceline, third sourceline or fourth sourceline.

In Example 94, the memory cell arrangement of Example 93 may optionally further include that, for each access device, an electrical behavior of the first control node and the third control node is controlled via the second control node.

In Example 95, the memory cell arrangement of Example 94 may optionally further include that the electrical behavior includes an electrical resistance associated with an electrical current flow between the first control node and the third control node.

In Example 96, the memory cell arrangement of any one of Examples 82 to 95 may optionally further include that all memory cells are arranged in a three-dimensional array configuration described by A(n,m,p).

In Example 97, the memory cell arrangement of any one of Examples 82 to 96 may optionally further include that each memory cell may include a first electrode portion and a second electrode portion.

In Example 98, the memory cell arrangement of Example 83 or 84 and Example 97 may optionally further include that each first electrode portion of a respective memory cell is (e.g., electrically conductively) connected to the corresponding access device.

In Example 99, the memory cell arrangement of Examples 14 and 31 may optionally further include that the first electrode portion of the first memory cell and the first electrode portion of the second memory cell are connected to the first access device via the first fourth control line, the first electrode portion of the third memory cell and the first electrode portion of the fourth memory cell are connected to the second access device via the second fourth control line; that the first electrode portion of the fifth memory cell and the first electrode portion of the sixth memory cell are connected to the third access device via the third control line; and that the first electrode portion of the seventh memory cell and the first electrode portion of the eighth memory cell are connected to the fourth access device via the fourth control line.

In Example 100, the memory cell arrangement of any one of Examples 97 to 99 may optionally further include that each second electrode portion of a respective memory cell is (e.g., electrically conductively) connected to the corresponding third control line.

In Example 101, the memory cell arrangement of any one of Examples 97 to 100 may optionally further include that the second electrode portions of respective one or more memory cells at least partially surround the corresponding first electrode portion.

In Example 102, the memory cell arrangement of any one of Examples 97 to 101 may optionally further include that the first electrode portion of the first memory cell and the first electrode portion of the second memory cell are part of or provide a common first electrode, the first electrode portion of the third memory cell and the first electrode portion of the fourth memory cell are part of or provide a common first electrode; that the first electrode portion of the fifth memory cell and the first electrode portion of the sixth memory cell are part of or provide a common first electrode; and/or that the first electrode portion of the seventh memory cell and the first electrode portion of the eighth memory cell are part of or provide a common first electrode.

In Example 103, the memory cell arrangement of Examples 92 and 102 may optionally further include that each common first electrode is configured as the corresponding sourceline, and/or wherein each common first electrode connects all corresponding memory cells to the corresponding access device.

In Example 104, the memory cell arrangement of Example 102 or 103 may optionally further include that the common first electrode includes an elongated shape with a base geometry of one of the following: a circle, a triangle, a square, a parallelogram, a trapezoid, an ellipse, a polygon, etc.

In Example 105, the memory cell arrangement of any one of Examples 97 to 104 may optionally further include that the second electrode portion of the first memory cell, the second electrode portion of the third memory cell, the second electrode portion of the fifth memory cell, and the second electrode portion of the seventh memory cell are part of or provide a common second electrode, and/or the second electrode portion of the second memory cell, the second electrode portion of the fourth memory cell, the second electrode portion of the sixth memory cell, and the second electrode portion of the eighth memory cell are part of or provide a common second electrode.

In Example 106, the memory cell arrangement of any one of Examples 105 may optionally further include that the common second electrode is (electrically conductive) connected to the corresponding third control line.

In Example 107, the memory cell arrangement of Example 105 or 106 may optionally further include that the common second electrode may include a plate shape.

In Example 108, the memory cell arrangement of Example 106 or 107 may optionally further include that the common second electrode completely surrounds the first electrode portions of the corresponding memory cells.

In Example 109, the memory cell arrangement of any one of Examples 97 to 108 may optionally further include that a ferroelectric portion is arranged between the first electrode portion and the second electrode portion of each of the memory cells.

In Example 110, the memory cell arrangement of Examples 102 and 109 may optionally further include that the memory cells associated to a common first electrode may include a common ferroelectric layer.

In Example 111, the memory cell arrangement of Example 109 or 110 may optionally further include that the first memory cell and the second memory cell may include a common ferroelectric layer (e.g., a continuous ferroelectric layer), that the third memory cell and the fourth memory cell may include a common ferroelectric layer (e.g., a continuous ferroelectric layer); that the fifth memory cell and the sixth memory cell may include a common ferroelectric layer (e.g., a continuous ferroelectric layer); and/or that the seventh memory cell and the eighth memory cell include a common ferroelectric layer (e.g., a continuous ferroelectric layer).

In Example 112, the memory cell arrangement of any one of Examples 109 to 111 may optionally further include that the ferroelectric portions of each memory cell at least partially surround the corresponding first electrode portion, preferably completely perimeterally surrounding the corresponding first electrode portion.

In Example 113, the memory cell arrangement of any one of Examples 109 to 112 may optionally further include that the ferroelectric portion includes ferroelectric hafnium oxide.

In Example 114, the memory cell arrangement of any one of Examples 109 to 113 may optionally further include that the ferroelectric portion is or may include a remanent-polarizable layer, optionally the remanent-polarizable layer includes a first polarization state with a first residual polarization and a second polarization state with a second residual polarization.

In Example 115, the memory cell arrangement of Example 114 may optionally further include that an absolute value of a first residual polarization of the remanent-polarizable layer associated with the first polarization state is substantially equal to an absolute value of a second residual polarization of the remanent-polarizable layer associated with the second polarization state.

In Example 116, the memory cell arrangement of any one of Examples 82 to 115 may optionally further include a write control circuit, configured to write (e.g., to program and/or erase) one of the memory cells.

In Example 117, the memory cell arrangement of Example 116 may optionally further include that writing the memory cell includes bringing the memory cell from one of at least two memory states into another one of the at least two memory states of the memory cell.

In Example 118, the memory cell arrangement of Example 116 or 117 may optionally further include that the write control circuit may be configured to apply one or more first voltages to the first bitline and/or the second bitline, one or more second voltages to the first wordline and/or the second wordline, and one or more third voltages to the first plateline and/or to the second plateline such that the memory cell to be written is written and other one or more memory cells are not written.

In Example 119, the memory cell arrangement of Example 118 may optionally further include that the memory cell to be written has a bitline of the first bitline or the second bitline, a wordline of the first wordline or the second wordline, and a plateline of the first plateline or to the second plateline associated therewith, the write control circuit is configured to write the memory cell to be written by supplying (applying) a first voltage to the associated bitline, a second voltage to the associated wordline, and a third voltage to the associated plateline.

In Example 120, the memory cell arrangement of Example 119 may optionally further include that the write control circuit may be further configured to supply (apply) another first voltage (e.g., a first inhibit voltage) to the other bitline, another second voltage (e.g., a second inhibit voltage) to the other wordline), and another third voltage (e.g., a third inhibit voltage) to the other plateline.

In Example 121, the memory cell arrangement of Example 120 may optionally further include that each access device is associated to a corresponding bitline and a corresponding wordline, and wherein the write control circuit is configured to supply (apply), for each access device, the first inhibit voltage to the corresponding bitline and the second inhibit voltage to the corresponding wordline such that a connection between the corresponding bitline and the memory cells corresponding to the access device is prohibited.

In Example 122, the memory cell arrangement of Example 120 or 121 may optionally further include that the write control circuit is configured to supply the third inhibit voltage supplied to the other plateline such that the memory cells sharing the other plateline do not change into another one of the at least two memory states of the respective memory cell.

In Example 123, the memory cell arrangement of any one of Examples 119 to 122 may optionally further include that the memory cell to be written further has one of the sourcelines associated therewith, and the write control circuit is further configured to supply (apply) one or more fourth voltages (e.g., a fourth voltage, e.g., a fourth inhibit voltage) to one or more sourcelines not associated with the memory cell to be written, In Example 124, the memory cell arrangement of Example 109 and any one of Examples 120 to 123 may optionally further include that the absolute value of the difference between the first voltage applied to the associated bitline and the third voltage applied to the associated plateline is larger than the absolute value of a coercive voltage of the ferroelectric portion.

In Example 125, the memory cell arrangement of any one of Examples 82 to 124 may optionally further include a read control circuit, configured to read out one of the memory cells.

In Example 126, the memory cell arrangement of Example 125 may optionally further include that reading the memory cell includes erasing the memory cell.

In Example 127, the memory cell arrangement of Example 125 or 126 may optionally further include that the read control circuit is configured to apply one or more first voltages to the first bitline and/or the second bitline, one or more second voltages to the first wordline and/or the second wordline, and one or more third voltages to the first plateline and/or to the second plateline, and In Example 128, the memory cell arrangement of Example 127 may optionally further include that the memory cell to be read out has a bitline of the first bitline or the second bitline, a wordline of the first wordline or the second wordline, and a plateline of the first plateline or the second plateline associated therewith, the read control circuit is further configured to detect a potential difference between the associated bitline and a reference voltage.

In Example 129, the memory cell arrangement of Example 128 may optionally further include that the read control circuit is configured to read out the memory cell to be read out by supplying (applying) a first voltage to the associated first control line, a second voltage to the associated second control line, and a third voltage to the associated third control line, and by detecting the potential difference between the corresponding first control line and the reference voltage.

In Example 130, the memory cell arrangement of Example 129 may optionally further include that the read control circuit is further configured to supply (apply) another first voltage (e.g., a first inhibit voltage) to the other bitline, another second voltage (e.g., a second inhibit voltage) to the other wordline), and another third voltage (e.g., a third inhibit voltage) to the other plateline.

In Example 131, the memory cell arrangement of Example 130 may optionally further include that each access device is associated to a corresponding bitline and a corresponding wordline, and wherein the read control circuit is configured to supply (apply), for each access device of, the first inhibit voltage to the corresponding bitline and the second inhibit voltage to the corresponding wordline such that a connection between the corresponding bitline and the memory cells corresponding to the access device is prohibited.

In Example 132, the memory cell arrangement of Example 130 or 131 may optionally further include that the read control circuit is configured to supply the third inhibit voltage supplied to the other plateline such that the memory cells sharing the other plateline do not change into another one of the at least two memory states of the respective memory cell.

In Example 133, the memory cell arrangement of any one of Examples 129 to 132 may optionally further include that the memory cell to be read out further has a sourceline associated therewith, and the read control circuit is further configured to supply (apply) one or more fourth voltages (e.g., a fourth voltage, e.g., a fourth inhibit voltage) to one or more of the sourcelines not associated with the memory cell to be read out.

In Example 133, the memory cell arrangement of Example 109 and any one of Examples 129 to 132 may optionally further include that the absolute value of the difference between the first voltage applied to the associated bitline and the third voltage applied to the associated plateline is larger than the absolute value of a coercive voltage of the ferroelectric portion.

Example 134 is a method of operating a memory cell arrangement, the method including: applying a first voltage to a first control line of a plurality of first control lines corresponding to a memory cell to be addressed (e.g., programmed, erased, or read out) of a plurality of memory cells. The other memory cells of the plurality of memory cells are not addressed, applying a second voltage to a second control line of a plurality of second control lines corresponding to the memory cell to be addressed; applying a third voltage to a third control line of a plurality of third control lines corresponding to the memory cell to be addressed.

In Example 135, the method of Example 134 may optionally further include: applying a first inhibit voltage to one or more first control lines of the plurality of first control lines not corresponding to the memory cell to be addressed, and applying a second inhibit voltage to one or more second control lines of the plurality of second control lines not corresponding to the memory cell to be addressed; the first inhibit voltage and the second inhibit voltage are configured to prohibit a connection between a first control line and one or more memory cells not to be addressed via an associated access device.

In Example 136, the method of Example 135 or 136 may optionally further include: applying a third inhibit voltage to one or more third control lines of the plurality of third control lines not corresponding to the memory cell to be addressed, the third inhibit voltage is configured to prohibit that one or more memory cells not to be addressed change into another one of at least two memory states of the respective memory cell.

It is noted that one or more functions described herein with reference to a memory cell, a remanent-polarizable portion, a memory cell arrangement, etc., may be accordingly part of a method, e.g., part of a method for operating a memory cell arrangement. Vice versa, one or more functions described herein with reference to a method, e.g., with reference to a method for operating a memory cell arrangement, may be implemented accordingly in a device or in a part of a device, for example, in a remanent-polarizable portion, a memory cell, a memory cell arrangement, etc.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. Memory cell arrangement, comprising:
   a first memory cell, a second memory cell, a third memory cell, a fourth memory cell, a fifth memory cell, a sixth memory cell, a seventh memory cell, and an eighth memory cell;
   a first bitline assigned to the first memory cell, the second memory cell, the third memory cell, and the fourth memory cell;
   a second bitline assigned to the fifth memory cell, the sixth memory cell, the seventh memory cell, and the eighth memory cell;

a first wordline assigned to the first memory cell, the second memory cell, the fifth memory cell, and the sixth memory cell;

a second wordline assigned to the third memory cell, the fourth memory cell, the seventh memory cell, and the eighth memory cell;

a first plateline assigned to the first memory cell, the third memory cell, the fifth memory cell, and the seventh memory cell;

a second plateline assigned to the second memory cell, the fourth memory cell, the sixth memory cell, and the eighth memory cell.

2. The memory cell arrangement of claim 1, wherein the first bitline, the first wordline, the second wordline, the first plateline, and the second plateline are configured to allow an addressing of the first memory cell, the second memory cell, the third memory cell, and the fourth memory cell; or wherein the second bitline, the first wordline, the second wordline, the first plateline, and the second plateline are configured to allow an addressing of the fifth memory cell, the sixth memory cell, the seventh memory cell, and the eighth memory cell.

3. The memory cell arrangement of claim 1, further comprising:

a first access device configured to connect the first bitline to the first memory cell and the second memory cell controlled by a voltage applied at the first wordline;

a second access device configured to connect the first bitline to the third memory cell and the fourth memory cell controlled by a voltage applied at the second wordline;

a third access device configured to connect the second bitline to the fifth memory cell and the sixth memory cell controlled by a voltage applied at the first wordline;

a fourth access device configured to connect the second bitline to the seventh memory cell and the eighth memory cell controlled by a voltage applied at the second wordline.

4. The memory cell arrangement of claim 3, further comprising:

a first sourceline connecting the first memory cell and the second memory cell with the first access device;

a second sourceline connecting the third memory cell and the fourth memory cell with the second access device;

a third sourceline connecting the fifth memory cell and the sixth memory cell with the third access device; and a fourth sourceline connecting the seventh memory cell and the eighth memory cell with the fourth access device.

5. The memory cell arrangement of claim 4, wherein each of the access devices comprises a first control node, a second control node, and a third control node, wherein the first control node of each access device is connected to the corresponding bitline of the first bitline or second bitline, wherein the second control node of each of the access devices is connected to the corresponding wordline of the first wordline or second wordline, and wherein the third control node of each of the access devices is connected to the corresponding sourceline of the first sourceline, second sourceline, third sourceline, or fourth sourceline.

6. The memory cell arrangement of claim 3, wherein at least one of the first access device, the second access device, the third access device, and/or the fourth access device comprises a transmission gate; or wherein at least one of the first access device, the second access device, the third access device, and/or the fourth access device comprises a transistor.

7. The memory cell arrangement of claim 1, wherein the first memory cell, the second memory cell, the third memory cell, the fourth memory cell, the fifth memory cell, the sixth memory cell, the seventh memory cell, and the eighth memory cell are remanent-polarizable memory cells.

8. The memory cell arrangement of claim 1, wherein the memory cells are arranged in a three-dimensional array configuration.

9. The memory cell arrangement of claim 1, wherein each of the memory cells comprises a first electrode portion and a second electrode portion.

10. The memory cell arrangement of claim 9, wherein each first electrode portion of a respective memory cell is connected to the corresponding access device, wherein the first electrode portion of the respective memory cell comprises a metallic material or at least no semiconducting material.

11. The memory cell arrangement of claim 1, wherein a first electrode portion of the first memory cell and a first electrode portion of the second memory cell are connected to a first access device via a first sourceline;

wherein a first electrode portion of the third memory cell and a first electrode portion of the fourth memory cell are connected to a second access device via a second sourceline;

wherein a first electrode portion of the fifth memory cell and a first electrode portion of the sixth memory cell are connected to a third access device via a third sourceline; or wherein a first electrode portion of the seventh memory cell and a first electrode portion of the eighth memory cell are connected to a fourth access device via a fourth sourceline.

12. The memory cell arrangement of claim 1, wherein a second electrode portion of each of the memory cells is connected to the corresponding plateline.

13. The memory cell arrangement of claim 1, wherein one or more second electrode portions of one or more of the memory cells at least partially surround a corresponding first electrode portion.

14. The memory cell arrangement of claim 1, wherein a first electrode portion of the first memory cell and a first electrode portion of the second memory cell are part of or provide a common electrode;

wherein a first electrode portion of the third memory cell and a first electrode portion of the fourth memory cell are part of or provide a common electrode;

wherein a first electrode portion of the fifth memory cell and a first electrode portion of the sixth memory cell are part of or provide a common electrode; and/or wherein a first electrode portion of the seventh memory cell and a first electrode portion of the eighth memory cell are part of or provide a common electrode.

15. The memory cell arrangement of claim 1, wherein a second electrode portion of the first memory cell, a second electrode portion of the third memory cell, a second electrode portion of the fifth memory cell, and a second electrode portion of the seventh memory cell are part of or provide a common electrode; or wherein a second electrode portion of the second memory cell, a second electrode portion of the fourth memory cell, a second electrode portion of the sixth memory cell, and a second electrode portion of the eighth memory cell are part of or provide a common electrode.

16. The memory cell arrangement of claim 1,
wherein, for each memory cell of the memory cells, a second electrode portion of the memory cell completely surrounds a first electrode portion of the memory cell, wherein a remanent-polarizable portion is arranged between the first electrode portion and the second electrode portion of the memory cell, wherein the first electrode portion comprises a first metallic material and the second electrode portion comprises a second metallic material such that the first electrode portion, the remanent-polarizable portion, and the second electrode portion form a stack structure comprising the first metallic material, a remanent-polarizable material in physical contact with the first metallic material, and the second metallic material in physical contact with the remanent-polarizable material.

17. The memory cell arrangement of claim 16,
wherein the remanent-polarizable portion of the memory cell perimeterally surrounds the first electrode portion of the memory cell.

\* \* \* \* \*